(12) United States Patent
Degner et al.

(10) Patent No.: US 9,423,841 B2
(45) Date of Patent: Aug. 23, 2016

(54) GASKETS FOR THERMAL DUCTING AROUND HEAT PIPES

(71) Applicant: Apple Inc., Cupertino, CA (US)

(72) Inventors: Brett W. Degner, Menlo Park, CA (US); William F. Leggett, San Francisco, CA (US); Jay S. Nigen, Mountain View, CA (US); Frank F. Liang, San Jose, CA (US); Richard H. Tan, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/012,661

(22) Filed: Feb. 1, 2016

(65) Prior Publication Data

US 2016/0147269 A1 May 26, 2016

Related U.S. Application Data

(62) Division of application No. 13/719,022, filed on Dec. 18, 2012, now Pat. No. 9,282,656.

(60) Provisional application No. 61/657,532, filed on Jun. 8, 2012, provisional application No. 61/657,454, filed on Jun. 8, 2012.

(51) Int. Cl.
*G06F 1/16* (2006.01)
*H05K 7/00* (2006.01)
*G06F 1/20* (2006.01)
*F28D 15/04* (2006.01)

(52) U.S. Cl.
CPC ............... *G06F 1/203* (2013.01); *F28D 15/04* (2013.01)

(58) Field of Classification Search
CPC ............ G06F 1/20; G06F 1/203; G06F 1/206

USPC ............ 361/679.01, 679.02, 679.46, 679.47, 361/679.48, 679.49, 679.52; 165/104.21, 165/104.26, 104.29, 104.33
See application file for complete search history.

(56) References Cited

U.S. PATENT DOCUMENTS

| | | | |
|---|---|---|---|
| 7,339,787 B2* | 3/2008 | Cheng | G06F 1/203 165/104.26 |
| 7,405,930 B2* | 7/2008 | Hongo | G06F 1/203 165/104.29 |
| 7,436,673 B2* | 10/2008 | Wang | G06F 1/20 165/104.33 |
| 8,218,312 B2* | 7/2012 | Watanabe | G06F 1/203 165/104.21 |
| 8,730,663 B2* | 5/2014 | Du | G06F 1/203 361/679.01 |
| 8,934,243 B2* | 1/2015 | Ito | G06F 1/203 361/679.48 |
| 8,971,037 B2* | 3/2015 | Kang | H01L 23/427 361/679.46 |
| 2007/0133174 A1* | 6/2007 | Mikami | G06F 1/203 361/700 |
| 2012/0039037 A1* | 2/2012 | Hsieh | G06F 1/181 361/679.49 |
| 2014/0022724 A1* | 1/2014 | Chao | G06F 1/20 361/679.47 |

* cited by examiner

*Primary Examiner* — Anthony Haughton
(74) *Attorney, Agent, or Firm* — Downey Brand LLP

(57) ABSTRACT

The disclosed embodiments provide a component for a portable electronic device. The component includes a gasket containing a rigid portion disposed around a bottom of a heat pipe, wherein the rigid portion forms a duct between a fan and an exhaust vent of the electronic device. The gasket also includes a first flexible portion bonded to the rigid portion, wherein the first flexible portion comprises a flap that is open during assembly of the heat pipe in the electronic device and closed over the heat pipe and the rigid portion to seal the duct around the heat pipe after the assembly.

20 Claims, 19 Drawing Sheets

⌐1800

```
TRANSFER THERMAL POWER FROM INTEGRATED CIRCUITS IN A PORTABLE
ELECTRONIC DEVICE OVER A DISTANCE FROM AN EVAPORATOR REGION OF
A SEALED HOUSING IN A HEAT PIPE TO HEAT EXCHANGERS AT CONDENSER
             REGIONS OF THE SEALED HOUSING
                          1810
                            ↓
     TRANSFER THE THERMAL POWER FROM THE SEALED HOUSING TO AN
   ENVIRONMENT EXTERNAL TO THE PORTABLE ELECTRONIC DEVICE USING
                     THE HEAT EXCHANGERS
                             1812
```

FIG. 18

GASKETS FOR THERMAL DUCTING AROUND HEAT PIPES

CROSS-REFERENCE TO RELATED APPLICATION(S)

This application is a continuation of U.S. application Ser. No. 13/719,022, filed Dec. 18, 2012, which claims the benefit of U.S. Provisional Application No. 61/657,532, filed Jun. 8, 2012, and U.S. Provisional Application No. 61/657,454, filed Jun. 8, 2012, the contents of each are herein incorporated by reference.

This application is also related to: U.S. Provisional Application No. 61/657,534, filed Jun. 8, 2012; U.S. Provisional Application No. 61/657,505, filed Jun. 8, 2012; and U.S. Provisional Application Ser. No. 61/657,538, filed Jun. 8, 2012, the contents of each are herein incorporated by reference.

FIELD

The disclosed embodiments relate to techniques for facilitating heat transfer in portable electronic devices.

RELATED ART

A modern portable electronic device typically contains a set of tightly packed components. For example, a laptop computer may include a keyboard, display, speakers, touchpad, battery, buttons, processor, memory, internal storage, and/or ports in an enclosure that is less than one inch thick, 8-11 inches long, and 12-16 inches wide. Moreover, most components in the portable electronic device generate heat, which must be dissipated to enable safe use of the portable electronic device and improve long-term reliability. For example, heat generated by components in a laptop computer may be transferred away from the components and out of the laptop computer to prevent damage to the components and increase user comfort and safety while operating the laptop computer.

However, heat-dissipation mechanisms for portable electronic devices generally involve the use of additional parts and/or materials. For example, heat sinks, cooling fans, heat pipes, thermal spreaders, and/or vents may be used to dissipate heat from components in a laptop computer. Such heat-dissipating parts and/or materials may take up space within the portable electronic devices and may add to the cost of the portable electronic devices.

Hence, space-efficient designs for portable electronic devices may be facilitated by more efficient and/or smaller heat-dissipation mechanisms in the portable electronic devices.

SUMMARY

The described embodiments include a component for use in a portable electronic device. The component includes a gasket containing a rigid portion disposed around a bottom of a heat pipe, wherein the rigid portion forms a duct between a fan and an exhaust vent of the electronic device. The gasket also includes a first flexible portion bonded to the rigid portion, wherein the first flexible portion comprises a flap that is open during assembly of the heat pipe in the electronic device and closed over the heat pipe and the rigid portion to seal the duct around the heat pipe after the assembly.

In some embodiments, the gasket also includes a second flexible portion bonded to one or more edges of the rigid portion, wherein the second flexible portion contacts the first flexible portion and the heat pipe to further seal the duct around the heat pipe.

In some embodiments, the first and second flexible portions further seal the duct around at least one of the fan, a bottom enclosure of the electronic device, a top enclosure of the electronic device, and the exhaust vent.

In some embodiments, the first and second flexible portions are bonded to the rigid portion using an overmolding technique.

In some embodiments, the first and second flexible portions form a compression seal around the heat pipe.

In some embodiments, the rigid portion includes plastic.

In some embodiments, the first flexible portion includes a rubber.

Another embodiment provides a heat pipe that facilitates heat transfer. The heat pipe includes a sealed housing having an outer surface, an inner surface, two ends and a height less than a predetermined value, where the sealed housing includes a wicking material along at least at least a portion of the inner surface and vapor cavities, and the sealed cavity includes a thermal transport material in a liquid state. Moreover, the heat pipe includes heat exchangers (such as convective-cooling fins), thermally coupled to the sealed housing, at condenser regions of the sealed housing proximate to the ends of the sealed housing. During operation of the heat pipe, the sealed housing supports a two-phase bidirectional flow of the thermal transport material in the liquid state in the wicking material and in a gas state in the vapor cavities to transport thermal power over a distance from an evaporator region of the sealed housing to the heat exchangers. Furthermore, the heat exchangers transfer the thermal power from the sealed housing to an environment external to the heat pipe, and a product of the thermal power and the distance (which is sometimes referred to as the 'heat transport requirement') exceeds a second predetermined value.

For example, the predetermined value may be less than or equal to 1.4 mm and/or the second predetermined value may be larger than or equal to 2,000 W-mm. In some embodiments, the thermal power is greater than or equal to 35 W (such as 40 or 60 W).

Moreover, the thermal transport material may include water.

Furthermore, the sealed housing and the wicking material may include copper. Note that the wicking material may include sintered particles having diameters less than 500 μm.

In some embodiments, the vapor cavities are located at opposite sides of a cross-section of the sealed housing.

Additionally, during operation of the heat pipe, the sealed housing may reduce acoustic sound associated with bubbles of the gas phase of the thermal transport material.

Another embodiment provides a portable electronic device that includes the heat pipe and an integrated circuit that generate heat during operation of the portable electronic device. This integrated circuit may be thermally coupled to the heat pipe, such as proximate to the evaporator region of the sealed housing.

Another embodiment provides a method for cooling a portable electronic device. During operation of the portable electronic device, heat generated by an integrated circuit in the portable electronic device is transported over the distance from the evaporator region of the sealed housing in the heat pipe to the heat exchangers at the condenser regions of the sealed housing. This thermal power is transported via the two-phase bidirectional flow of the thermal transport material in the liquid state and in the gas state in the sealed housing, where the sealed housing has the height less than the predetermined value, and the product of the thermal power and the distance (or effective length) exceeds the second predetermined value. Then, using the heat exchangers, the thermal power is transferred from the sealed housing to the environment external to the portable electronic device.

BRIEF DESCRIPTION OF THE DRAWINGS

FIG. 18 is a flowchart illustrating a method for cooling a portable electronic device in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Figure 1:
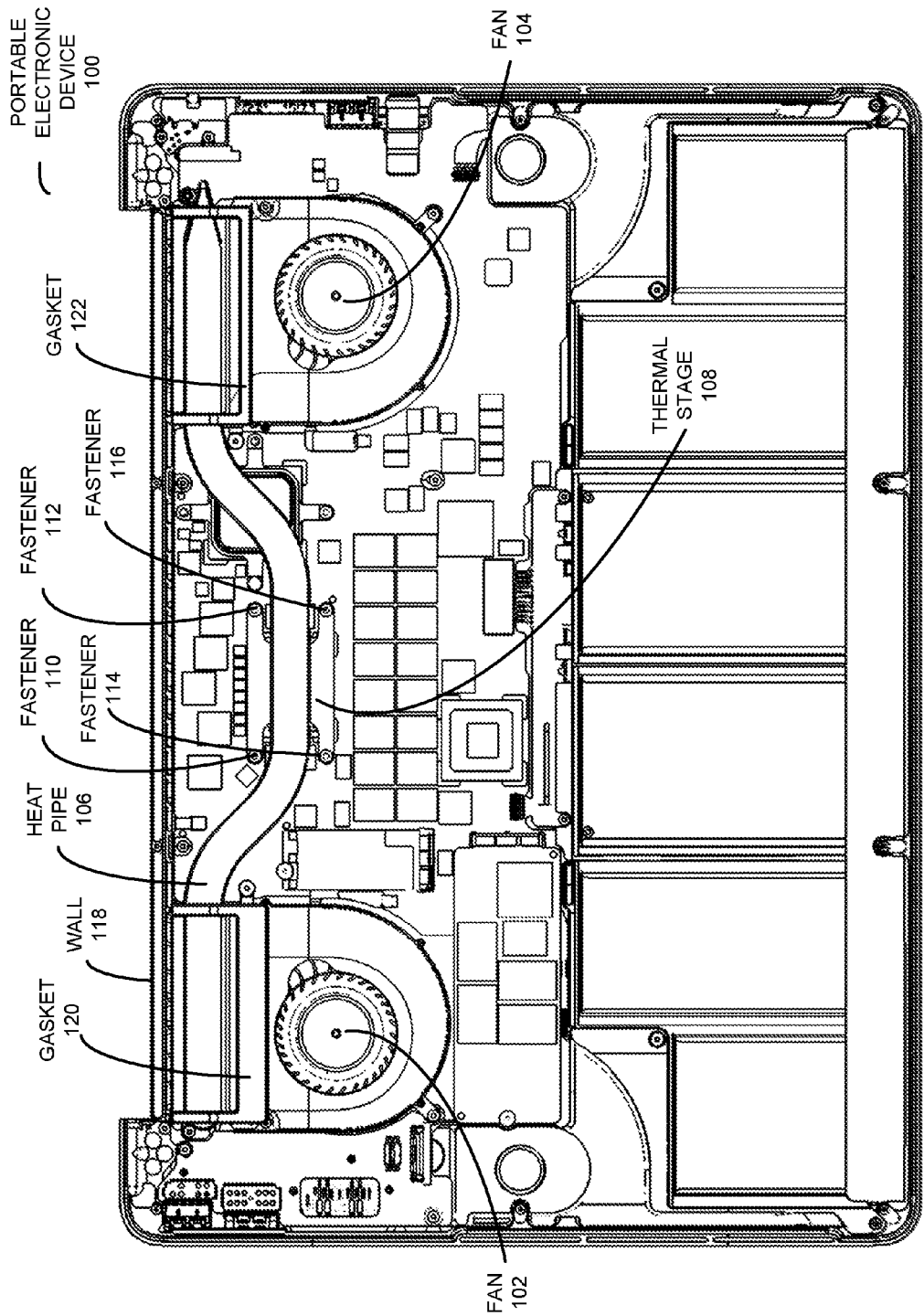
FIG. 1 is a block diagram illustrating a bottom view of a portable electronic device in accordance with an embodiment of the present disclosure.

FIG. 1 shows a bottom view of a portable electronic device 100, such as a laptop computer, with the bottom of the enclosure of portable electronic device 100 removed. Within portable electronic device 100, a number of components may be used to cool heat-generating components such as central-processing units (CPUs), graphics-processing units (GPUs), and/or video memory.

First, portable electronic device 100 may include a set of fans 102-104 for expelling heat generated by the heat-generating components outside portable electronic device 100. Fans 102-104 may utilize a set of intake and exhaust vents along a wall 118 of portable electronic device 100 to draw in cooler air from outside portable electronic device 100, circulate the air around the interior of portable electronic device 100 to dissipate heat from the heat-generating components, and expel the heated air out of portable electronic device 100.

Portable electronic device 100 may also include a heat pipe 106 that conducts heat away from one or more of the heat-generating components toward the flow of exhaust from fans 102-104. For example, heat pipe 106 may be a sealed pipe of a thermally conductive material, such as copper, filled with a working fluid such as: water, ethanol, acetone, sodium, and/or mercury in a partial vacuum. The working fluid may evaporate to vapor at the thermal interface with a heat-generating component closer to the center of heat pipe 106, migrate to an end of heat pipe 106 that is cooled by a fan (e.g., fans 102-104), and condense back into liquid after the heat is removed by the fan. A sintered material (e.g., metal powder) in the interior of heat pipe 106 may then exert capillary pressure on the condensed liquid, conducting the liquid back to the heated portion of heat pipe 106 for subsequent transfer of heat away from the heat-generating component.

To further facilitate heat dissipation from the heat-generating component, a thermal stage 108 may apply a spring force between heat pipe 106 and the heat-generating component. For example, thermal stage 108 may be bonded to heat pipe 106 using a solder and fastened to a surface within portable electronic device 100 using a set of fasteners 110-116 to increase the amount of heat transferred along a thermal interface between the heat-generating component and heat pipe 106.

In one or more embodiments, heat-dissipation mechanisms and/or components in portable electronic device 100 may include a number of characteristics and/or features that increase the transfer of heat away from the heat-generating components and/or facilitate efficient use of space within portable electronic device 100. First, fasteners 110-116 may both fasten thermal stage 108 to a surface within portable electronic device 100 and create a thermal gap between heat pipe 106 and the enclosure of portable electronic device 100, as discussed below with respect to FIG. 2. Second, thermal stage 108 may include two thicknesses to reduce an overall thickness of portable electronic device 100 while maintaining the spring force necessary to adequately cool the heat-generating component over which thermal stage 108 and heat pipe 106 are disposed, as described in further detail below with respect to FIGS. 3-4.

Third, wall 118 may include intake vents that are directed at a first angle toward one or more heat-generating components of portable electronic device 100 and exhaust vents directed at a second angle out of portable electronic device 100 to avoid a display of portable electronic device 100. Wall 118 may also include one or more obstructed vents between the intake and exhaust vents, as well as mechanisms for reducing the temperature of hot spots in the enclosure of portable electronic device 100. Wall 118 is described in further detail below with respect to FIGS. 5-8.

Finally, a set of gaskets 120-122 may provide thermal ducts between fans 102-104 and exhaust vents in wall 118 to prevent exhaust from recirculating inside portable electronic device 100 and reducing the effectiveness of heat dissipation from the heat-generating components. As discussed below with respect to FIGS. 9-11, gaskets 120-122 may include a rigid section that forms the duct, as well as a set of flexible sections that simplify assembly of heat pipe 106 on top of the rigid section and subsequently seal the duct around heat pipe 106.

Figure 2:
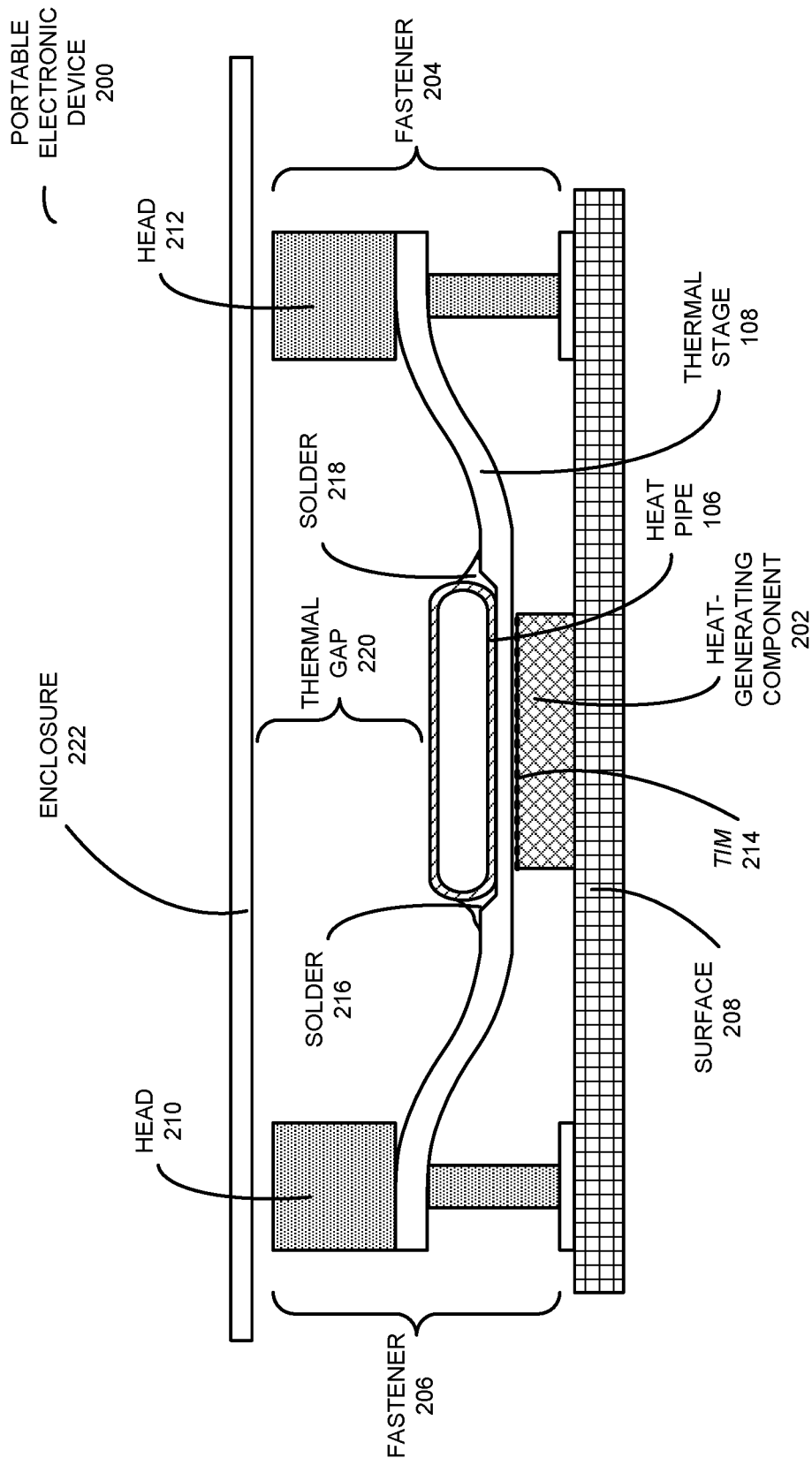
FIG. 2 is a block diagram illustrating a cross-sectional view of a system for facilitating heat transfer in a portable electronic device in accordance with an embodiment of the present disclosure.

FIG. 2 shows a cross-sectional view of a system for facilitating heat transfer in a portable electronic device 200 (e.g., portable electronic device 100 of FIG. 1). The system includes heat pipe 106 and thermal stage 108, both of which are disposed over a heat-generating component 202 such as a CPU and/or GPU.

As shown in FIG. 2, thermal stage 108 may be disposed along a thermal interface in between heat pipe 106 and heat-generating component 202. A thermal interface material (TIM) 214 may also be disposed within the thermal interface between heat-generating component 202 and thermal stage 108 to increase the thermal contact conductance between heat-generating component 202 and thermal stage 108.

In one or more embodiments, the spring force of thermal stage 108 is used to increase thermal contact between heat-generating component 202 and heat pipe 106. For example, thermal stage 108 may improve heat conduction between heat-generating component 202 and heat pipe 106 by reducing the thickness and, in turn, the thermal resistance of TIM 214. As a result, thermal stage 108 may be made of a material with a high thermal conductivity and spring constant, such as copper titanium.

To provide thermal contact between heat-generating component 202 and heat pipe 106, heat pipe 106 may be joined to thermal stage 108 using a solder 216-218, and thermal stage 108 may be fastened to a surface 208 within portable electronic device 200 using a set of fasteners 204-206 (e.g., fasteners 110-116 of FIG. 1). For example, fasteners 204-206 may include one or more screws that fasten a set of wings of thermal stage 108 to a printed circuit board (PCB) containing heat-generating component 202. Fasteners 204-206 and thermal stage 108 may thus apply downward force onto heat-generating component 202 and increase the thermal coverage of heat-generating component 202 by heat pipe 106.

Fasteners 204-206 may additionally form a thermal gap 220 between heat pipe 106 and an enclosure 222 of portable electronic device 200. Continuing with the above example, screws used to provide fasteners 204-206 may have tall heads 210-212 that provide a 0.5 mm-0.8 mm thermal gap 220 and/or plenum through which air may flow to further cool heat-generating component 202 and/or other heat-generating components in portable electronic device 200. Alternatively, other types of fasteners 204-206 may be used to provide thermal gap 220, including: clips, barbed fasteners, bolts, clamps, pins, pegs, and/or clasps.

Thermal gap 220 may also prevent heat pipe 106 from thermally contacting enclosure 222 if portable electronic device 200 is dropped and/or impacts another object. For example, fasteners 204-206 may be placed around heat-generating component 202 if heat-generating component 202 is located relatively far from an attachment point of a metal enclosure 222 to ensure that trampolining in enclosure 222 does not cause heat pipe 106 to transfer heat to enclosure 222 and/or a surface contacting enclosure 222. Fasteners 204-206 may further be attached to a surface (e.g., the center of a PCB) with lower stiffness so that the impact does not damage heat-generating component 202 and/or other nearby components.

However, the proximity of fasteners 204-206 to enclosure 222 may result in physical contact between fasteners 204-206 and enclosure 222. For example, fasteners 204-206 may touch enclosure 222 if fasteners 204-206 are designed to be intimate with enclosure 222 and/or if fasteners 204-206 are brought in contact with enclosure 222 during impact between enclosure 222 and a hard object.

As a result, fasteners 204-206 may include an insulating material to prevent fasteners 204-206 from heating enclosure 222 in the event of physical contact between the fasteners 204-206 and enclosure 222. For example, fasteners 204-206 may be made of plastic to reduce thermal conduction between fasteners 204-206 and enclosure 222. Consequently, fasteners 204-206 may improve thermal contact between heat-generating component 202 and heat pipe 106, provide thermal gap 220 as a channel for airflow and/or heat dissipation from heat-generating component 202 and/or heat pipe 106, and facilitate safe operation of portable electronic device 200 by thermally insulating enclosure 222 from heat-generating component 202 and/or heat pipe 106.

Figure 3:
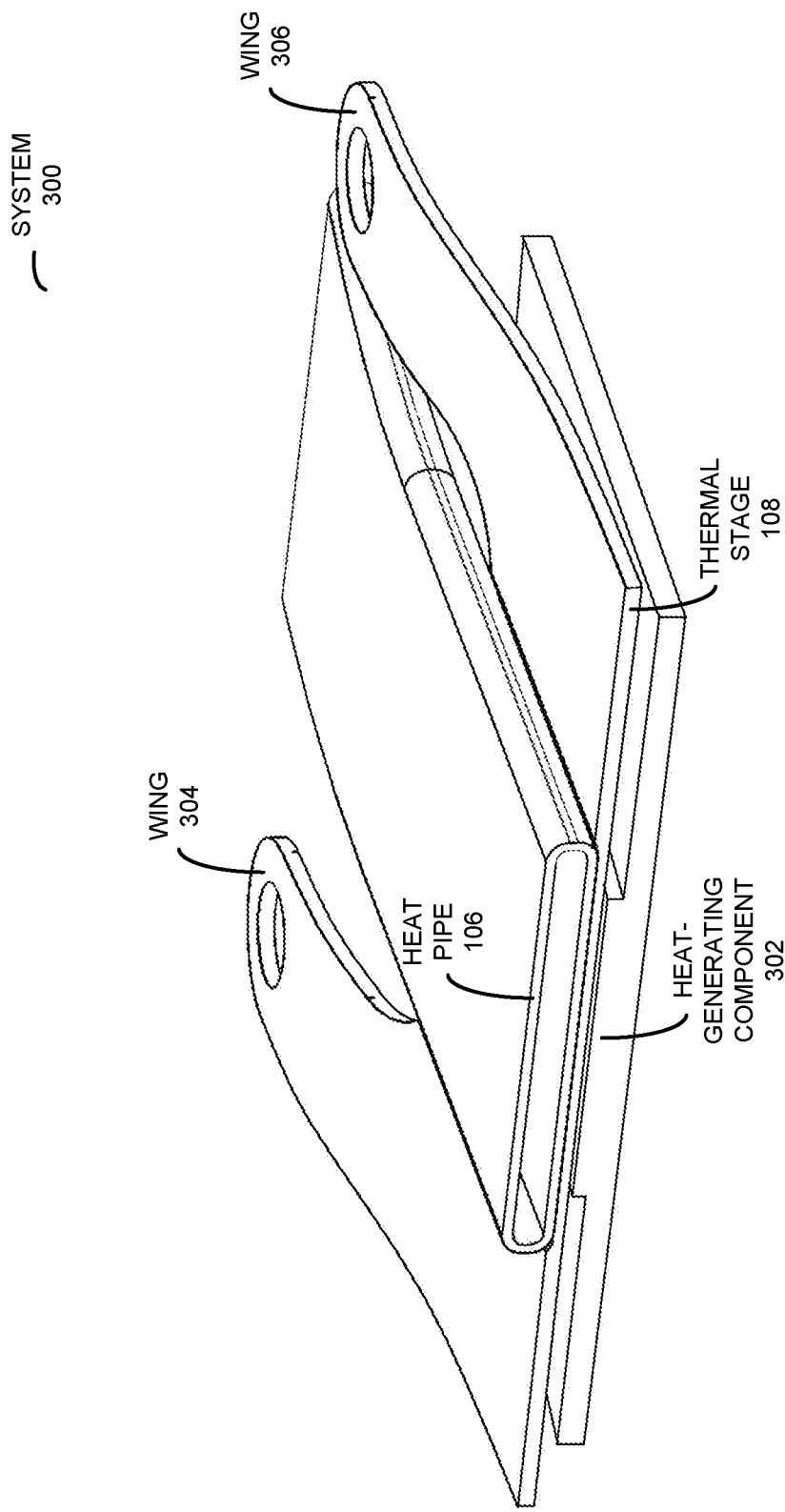
FIG. 3 is a block diagram illustrating a sectional view of a system for facilitating heat transfer in a portable electronic device in accordance with an embodiment of the present disclosure.

FIG. 3 shows a sectional view of a system 300 for facilitating heat transfer in a portable electronic device. As mentioned above, system 300 may include heat pipe 106 and thermal stage 108, both of which are disposed over a heat-generating component 302 (e.g., a CPU). Heat pipe 106 may be soldered to thermal stage 108, and a set of wings 304-306 of thermal stage 108 may be fastened to a surface within the portable electronic device to apply a spring force to heat-generating component 302. For example, the fastening of wings 304-306 that are angled upward to a PCB containing heat-generating component 302 may apply a downward force onto heat-generating component 302 and increase the thermal contact conductance between heat-generating component 302 and heat pipe 106.

Figure 4:
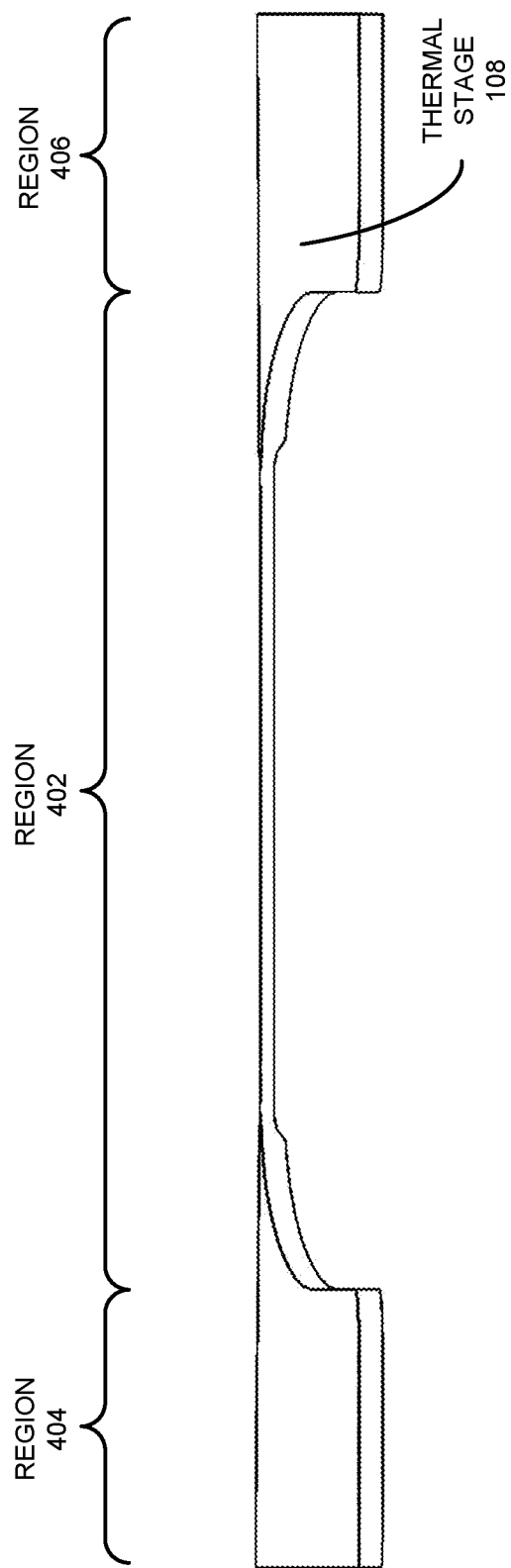
FIG. 4 is a block diagram illustrating a side view of a thermal stage in accordance with an embodiment of the present disclosure.

FIG. 4 shows a side view of thermal stage 108. Thermal stage 108 may include a number of regions 404-406 with different thicknesses. In particular, region 402 may be of a first thickness, and regions 404-406 may be of a second thickness that is greater than the first thickness.

The first and/or second thicknesses may be created in thermal stage 108 using a number of techniques. For example, a machining technique may be used to form a trough in a material (e.g., copper titanium) of uniform stock thickness. Similarly, a profile corresponding to the first thickness may also be formed in raw stock using a rolling technique. The first thickness may further be created by removing material from uniform stock using a skiving technique, continuous machining technique, and/or chemical-etching technique. A forging and/or coining technique may be used to press the first thickness into uniform stock, or a casting technique may be used to form the first and second thicknesses from a mold.

As mentioned above, the first thickness may accommodate a heat pipe (e.g., heat pipe 106 of FIG. 1). For example, the first thickness may form a notch and/or groove within which the heat pipe may be placed to reduce an overall thickness of the portable electronic device containing thermal stage 108 and the heat pipe. On the other hand, the second thickness may increase a spring force between a heat-generating component and the heat pipe, allowing for better thermal transfer between the heat-generating component (e.g., a high-power CPU) and the heat pipe. For example, the second thickness may be used in the wings (e.g., wings 304-306 of FIG. 3) of thermal stage 108 to increase the downward force applied by thermal stage 108 and/or a set of fasteners (e.g., fasteners 110-116 of FIG. 1) onto the top of the heat-generating component. Consequently, the first and second thicknesses may facilitate both efficient use of space within the portable electronic device and increased cooling of the heat-generating component by the heat pipe.

Figure 5:
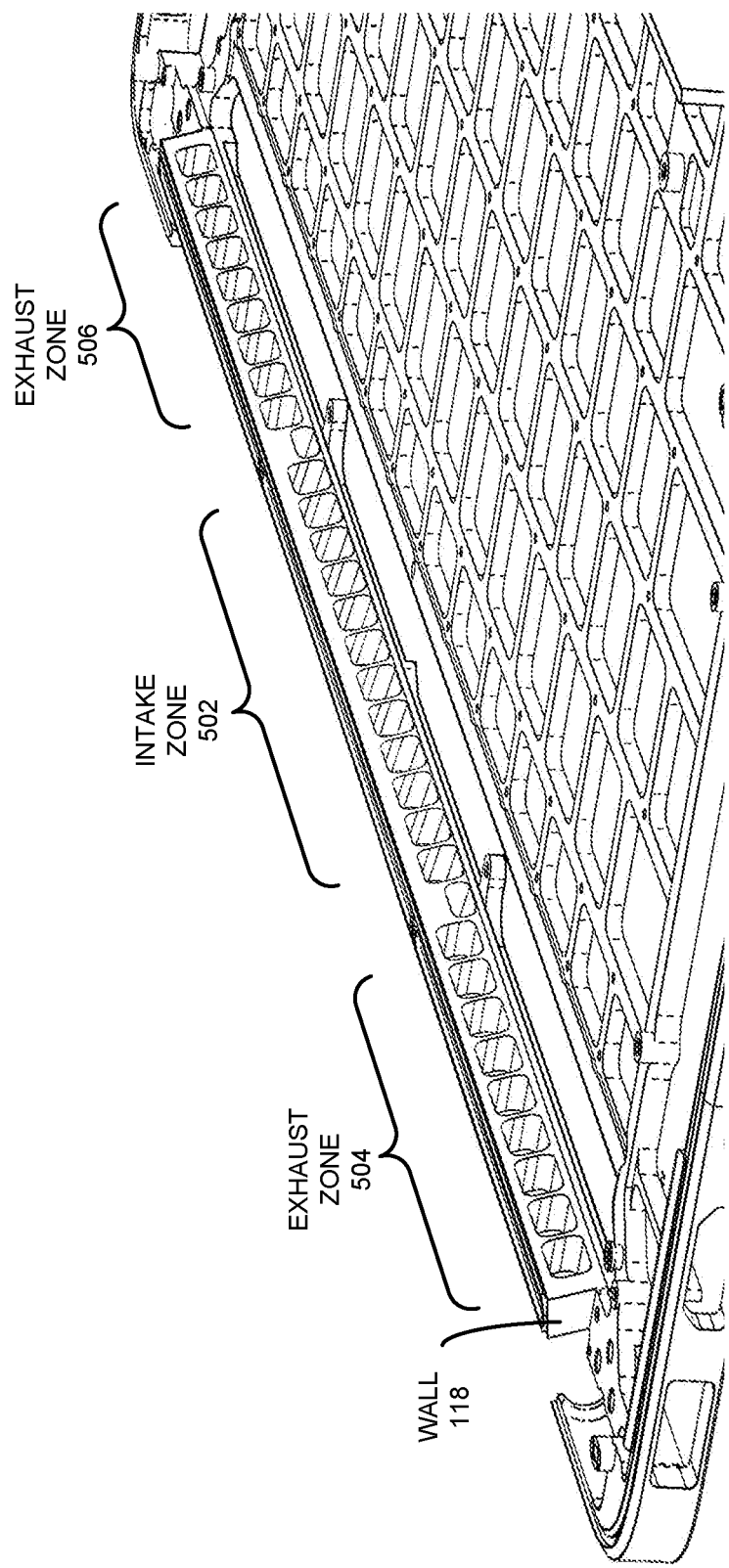
FIG. 5 is a block diagram illustrating a wall in a portable electronic device in accordance with an embodiment of the present disclosure.

FIG. 5 shows wall 118. Wall 118 may be a rear wall of a portable electronic device, such as a laptop computer. The rear wall may be integrated into a top case of the laptop computer to reduce the number of seams and/or components in the laptop computer's enclosure. For example, instead of creating wall 118 as a separate part and subsequently joining wall 118 to the top case, wall 118 may be machined out of the top case. In turn, the reduced number of seams and/or components in the enclosure may mitigate electromagnetic interference caused by the enclosure and/or improve the rigidity and/or height tolerance of the enclosure.

As shown in FIG. 5, wall 118 includes an intake zone 502 and two exhaust zones 504-506. Intake zone 502 includes a set of intake vents around the center of wall 118 that allow a set of fans (e.g., fans 102-104 of FIG. 1) to draw cooler air from the exterior of the portable electronic device into the portable electronic device. The fans may then circulate the air inside a set of plenums and/or thermal gaps (e.g., thermal gap 220 of FIG. 2) within the portable electronic device and expel the heated air out of the portable electronic device through a set of exhaust vents in exhaust zones 504-506 on either side of intake zone 502. As discussed in further detail below with respect to FIGS. 7-8, the intake vents may be directed at a first angle toward one or more heat-generating components of the portable electronic device, and the exhaust vents may be directed at a second angle out of the portable electronic device.

Figure 6:
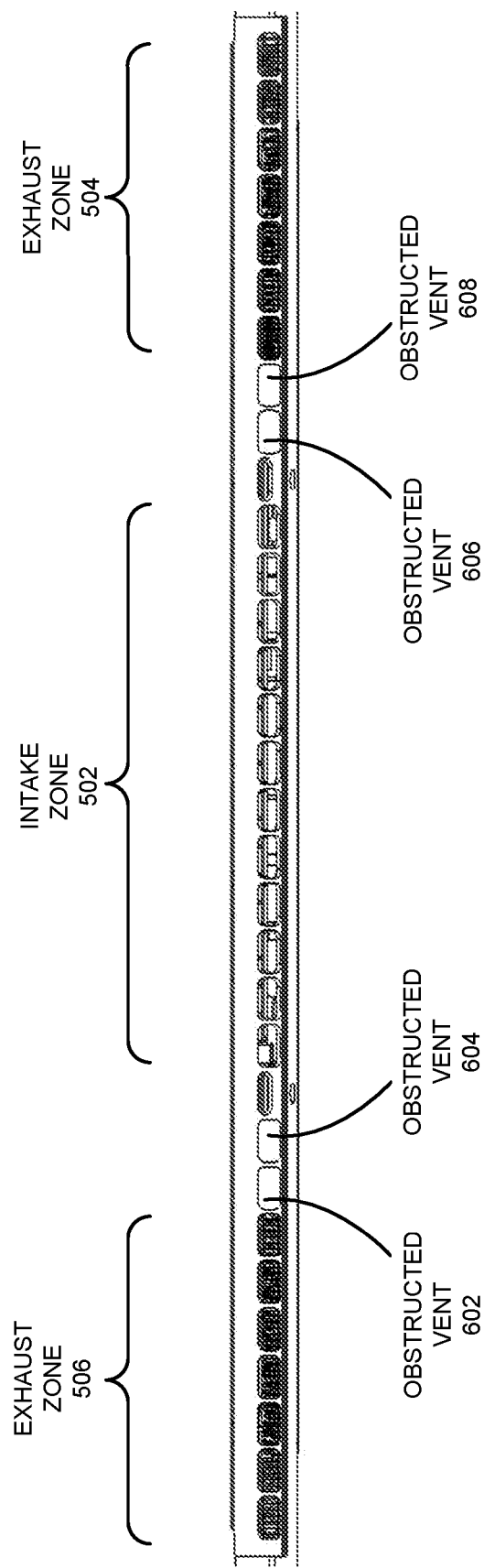
FIG. 6 is a block diagram illustrating a rear view of a set of intake and exhaust zones in a portable electronic device in accordance with an embodiment of the present disclosure.

FIG. 6 shows a rear view of a set of intake and exhaust zones 502-506 of a portable electronic device. As described above, intake zone 502 may include a set of intake vents that are used by fans to draw in air from outside the portable electronic device, while each exhaust zone 504-506 may include a set of exhaust vents that are used by the fans to expel heated air out of the portable electronic device.

In addition, a set of obstructed vents 602-608 may separate intake zone 502 from exhaust zones 504-506. Air flow from vents 602-608 may be blocked from the inside of the portable electronic device by a portion of a duct formed by a gasket in the portable electronic device, as described below with respect to FIG. 10. Such obstruction of substantially evenly spaced openings in intake and exhaust zones 502 and exhaust zones 504-506 may maintain the cosmetic continuity of the vents in intake and exhaust zones 502-506, reduce electromagnetic interference from the enclosure of the portable electronic device, and facilitate heat dissipation in the portable electronic device by separating the intake and exhaust flows passing through intake and exhaust zones 502-506, respectively.

Figure 7:
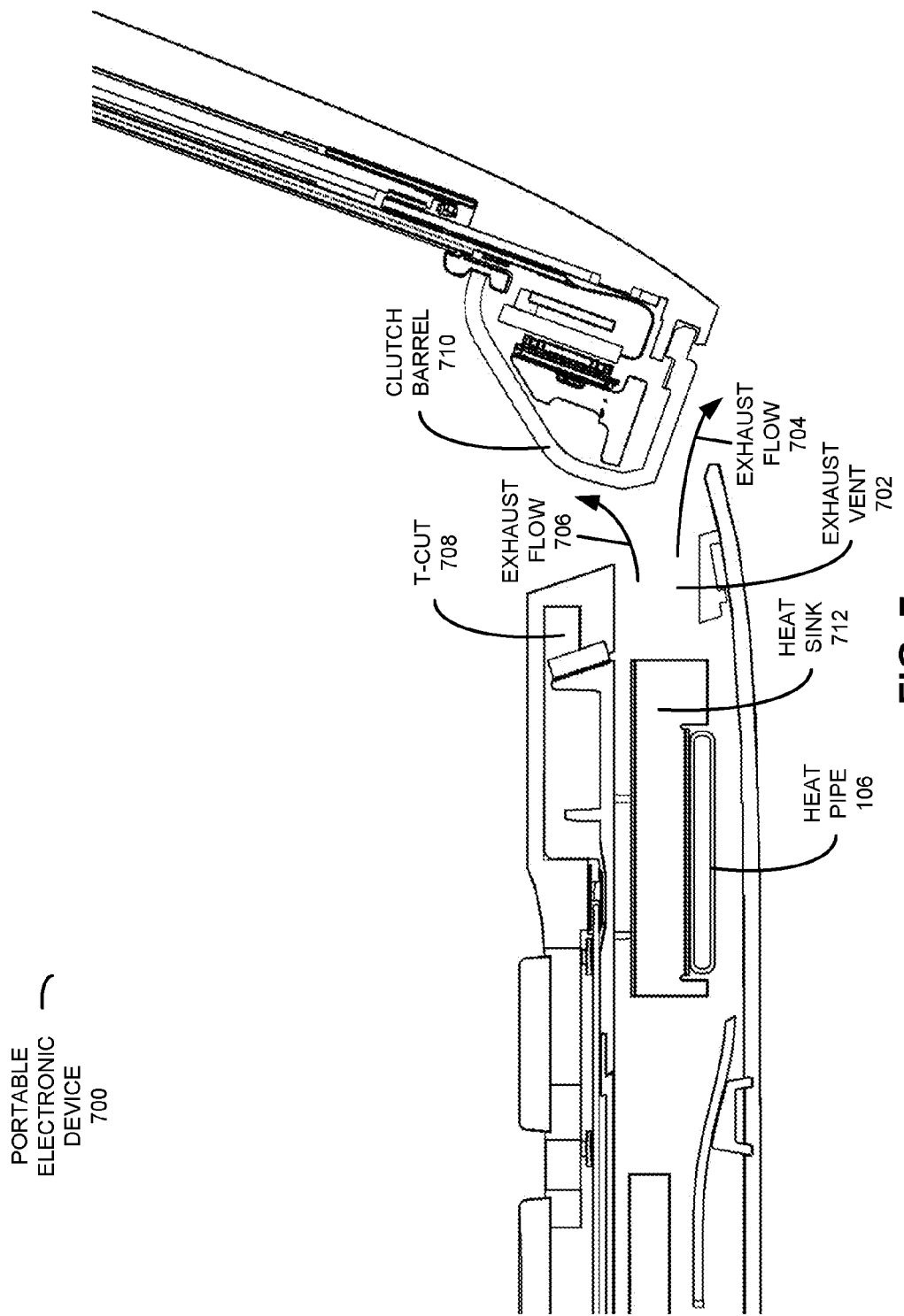
FIG. 7 is a block diagram illustrating a cross-sectional view of a portable electronic device in accordance with an embodiment of the present disclosure.

FIG. 7 shows a cross-sectional view of a portable electronic device 700. More specifically, FIG. 7 shows a cross-sectional view of an exhaust vent 702 from an exhaust zone (e.g., exhaust zones 504-506 of FIG. 5) in a wall (e.g., wall 118 of FIG. 1) of portable electronic device 700. Air from the interior of portable electronic device 700 may be moved by a fan (e.g., fans 102-104 of FIG. 1) across heat pipe 106 and a heat sink 712, where the air is heated and expelled as exhaust out of exhaust vent 702.

In addition, two flows 704-706 of exhaust out of vent 702 may be created by a clutch barrel 710 connecting a display of portable electronic device 700 (e.g., a laptop computer) to the bottom portion of portable electronic device 700. Flow 704 may exit portable electronic device 700 along the bottom of clutch barrel 710, while flow 706 may exit portable electronic device 700 over the top of clutch barrel 710. To prevent exhaust from changing the white point of and/or accelerating degradation in the display, exhaust vent 702 may be directed at an angle out of portable electronic device 700 so that exhaust flows 704-706 avoid the display and/or do not create a large temperature gradient across the display. If the display is closed over the bottom portion of portable electronic device 700, flow 706 may cease, and all exhaust may be expelled out of vent 702 through an air gap between the bottom of portable electronic device 700 and clutch barrel 710.

Those skilled in the art will appreciate that exhaust flowing out of exhaust vent 702 may also heat material in the wall near exhaust vent 702 and create a hot spot in the enclosure of portable electronic device 700. As a result, a T-cut 708 may be made in the material to reduce the thickness of the material and, in turn, the transfer of heat through the material. At the same time, the thickness of the material between exhaust vent 702 and one or more intake vents in portable electronic device 700 may be maintained to facilitate lateral conduction of heat from exhaust vent 702 to the intake vent(s), thus further reducing the temperature of the hot spot. Consequently, the relatively large size of exhaust vent 702, T-cut 708, and/or ridges at the bottom of exhaust vent 702 may provide a lightweight structure with thermally minimal spars, a reduced conduction path to both the top and bottom enclosures of portable electronic device 700, and a lateral conduction path between the exhaust and intake zones in the wall.

Figure 8:
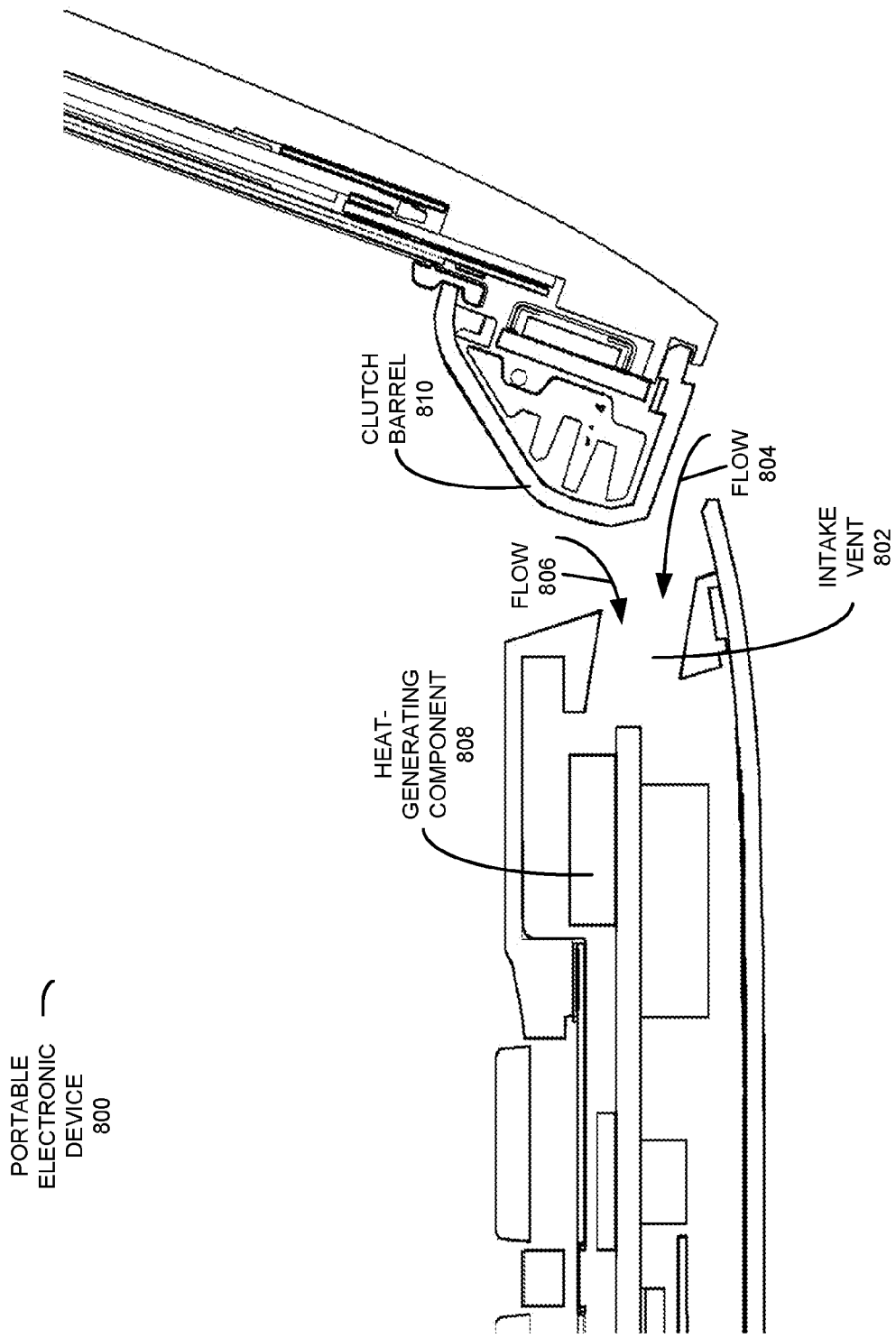
FIG. 8 is a block diagram illustrating a cross-sectional view of a portable electronic device in accordance with an embodiment of the present disclosure.

FIG. 8 shows a cross-sectional view of a portable electronic device 800. In particular, FIG. 8 shows a cross-sectional view of an intake vent 802 from an intake zone (e.g., intake zone 502 of FIG. 5) in a wall (e.g., wall 118 of FIG. 1) of portable electronic device 800. Intake vent 802 may allow cooler air from outside portable electronic device 800 to be drawn into portable electronic device 800 by a fan (e.g., fans 102-104 of FIG. 1) and circulated within portable electronic device 800 before being expelled as exhaust out of one or more exhaust vents (e.g., exhaust vent 702 of FIG. 7) in the wall.

Two flows 804-806 of air may pass through intake vent 802 while a display of portable electronic device 800 (e.g., a laptop computer) is open. Flow 804 may enter portable electronic device 800 along the bottom of a clutch barrel 810 connecting the display to the bottom of portable electronic device 800, while flow 806 may enter portable electronic device 800 from the top of clutch barrel 810. If the display is closed over the bottom of portable electronic device 800, flow 806 may cease, and all air drawn in through intake vent 802 may flow 804 from an air gap between the bottom of portable electronic device 800 and clutch barrel 810.

Moreover, intake vent 802 may be directed at an upward angle toward a heat-generating component 808 of portable electronic device 800 to facilitate heat dissipation from heat-generating component 808. For example, intake vent 802 may channel air over the top of a PCB containing video memory to cool the video memory and/or other heat-generating components at the top of the PCB. As a result, air passing through intake vent 802 may dissipate heat from heat-generating component 808 better than air passing through an intake vent that is not angled upwards into the interior of portable electronic device 800.

Figure 9:
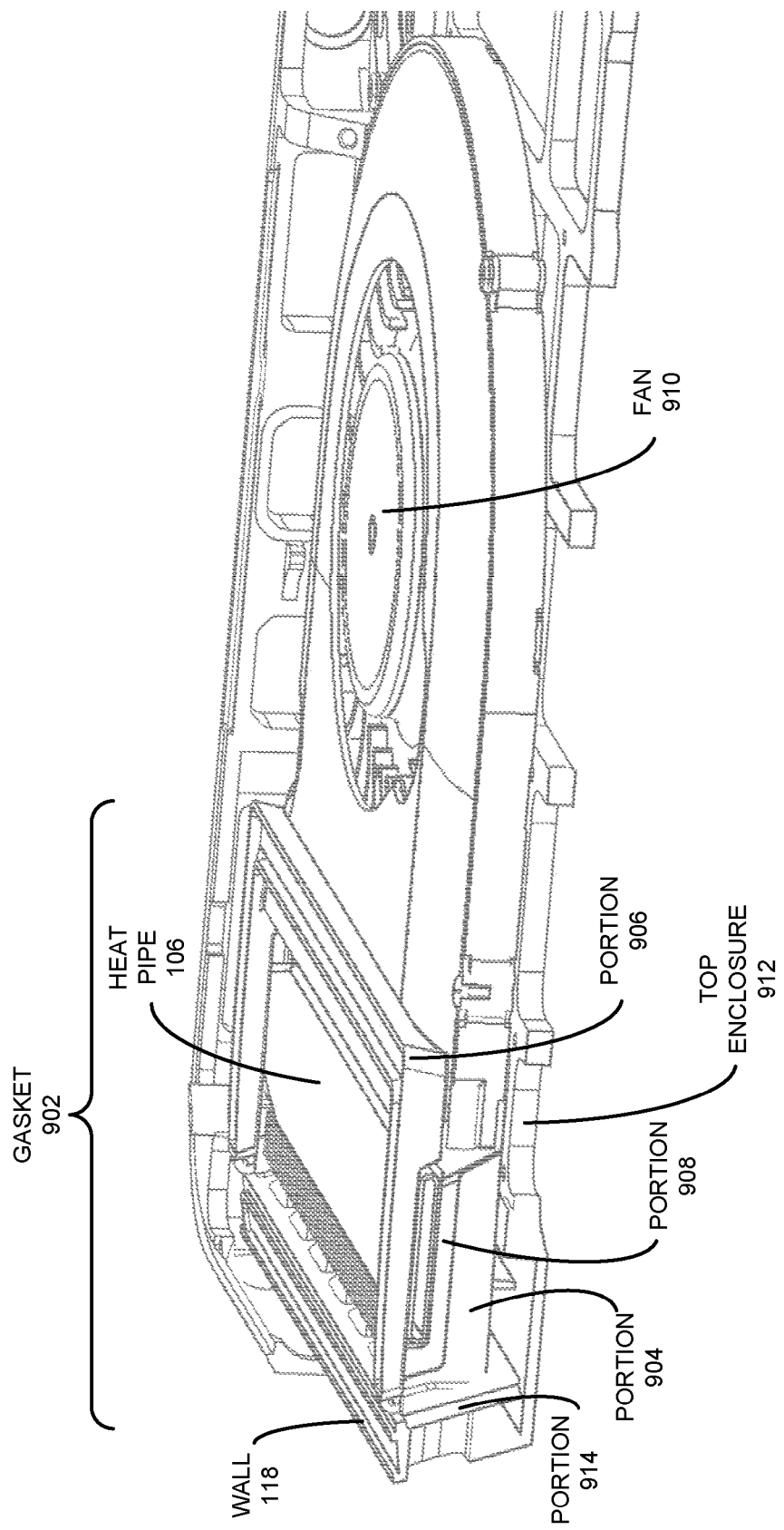
FIG. 9 is a block diagram illustrating a gasket in a portable electronic device in accordance with an embodiment of the present disclosure.

FIG. 9 shows a gasket 902 (e.g., gaskets 120-122 of FIG. 1) in a portable electronic device. As mentioned above, gasket 902 may form a thermal duct between a fan 910 and a set of exhaust vents in wall 118 to prevent exhaust from recirculating inside the portable electronic device and reducing the effectiveness of heat dissipation from heat-generating components in the portable electronic device.

As shown in FIG. 9, gasket 902 may include three portions 904-908. A rigid portion 904 may be disposed around a bottom of heat pipe 106 to form the duct between fan 910 and wall 118. Two flexible portions 904-906 may then be bonded to rigid portion 904 so that gasket 902 is manufactured as a single component instead of multiple components that require multiple steps to assemble into gasket 902. For example, flexible portions 904-906 may be made of a rubber that is bonded to a rigid portion 904 made of plastic using an overmolding technique.

Portion 906 may be a flap that is open during assembly of heat pipe 106 in the portable electronic device to allow heat pipe 106 to be placed over portions 904 and 908. Portion 906 may then be closed over heat pipe 106 and portions 904 and 908 to seal the duct around heat pipe 106 after the assembly. Portions 904-906 may further seal the duct around fan 910, a bottom enclosure (not shown) of the portable electronic device, a top enclosure 912 of the portable electronic device, and/or exhaust vents in wall 118. For example, portion 906 may fold over portions 904 and 908 to seal along the top of fan 910, the top and/or sides of heat pipe 106, and/or the bottom enclosure. On the other hand, portion 908 may be bonded to one or more edges of portion 904 and seal along the bottom of fan 910, the bottom and/or sides of heat pipe 106, top enclosure 912, and/or wall 118. Gasket 902 may also include an additional flexible portion 914 that seals the duct along wall 118. Alternatively, portion 914 may be provided by a separate component (e.g., a gasket) disposed between gasket 902 and wall 118.

Figure 10:
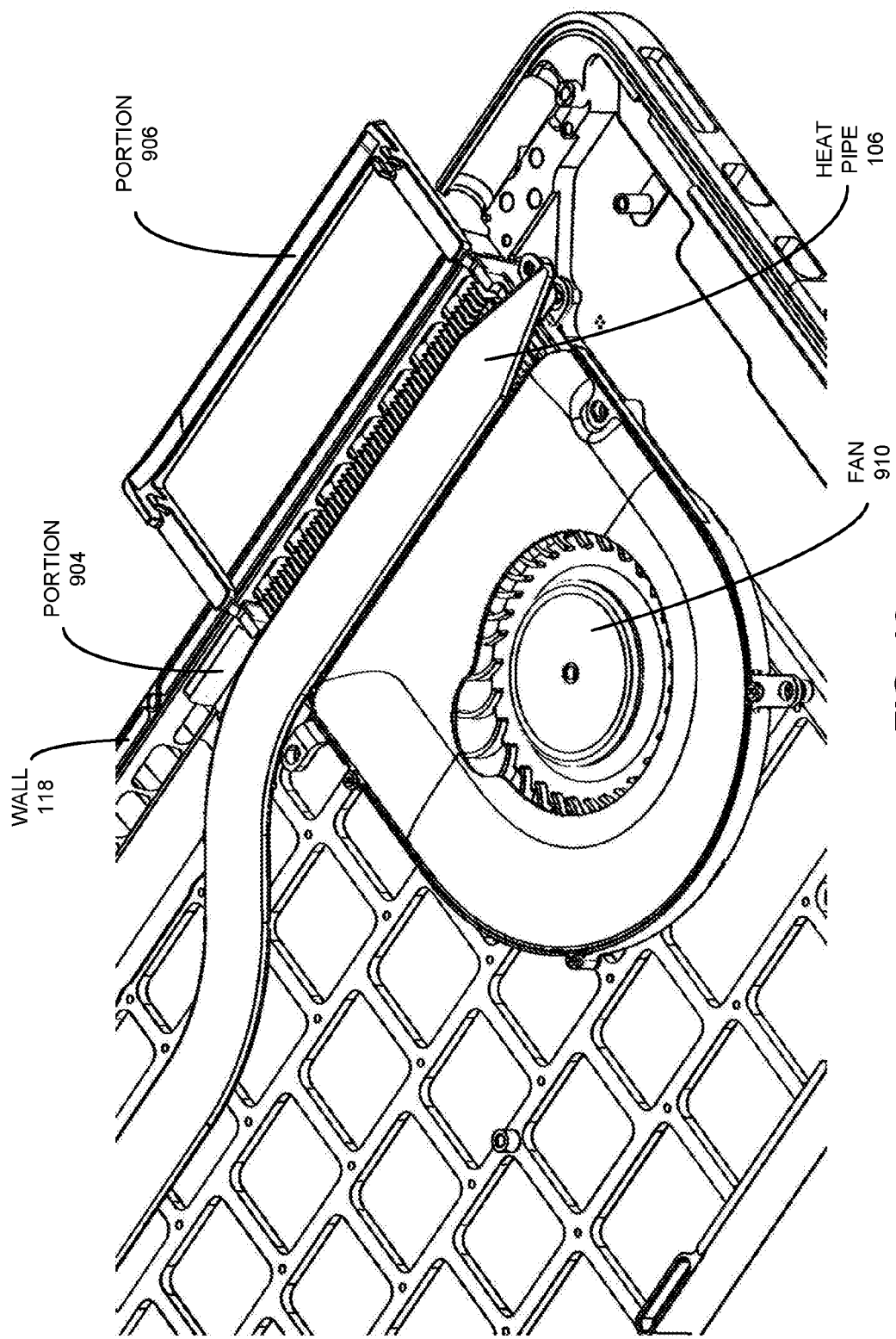
FIG. 10 is a block diagram illustrating a flexible portion of a gasket in accordance with an embodiment of the present disclosure.

FIG. 10 shows flexible portion 906 of a gasket (e.g., gasket 902 of FIG. 9). As mentioned above, portion 906 includes a flap that is open during assembly of heat pipe 106 in the portable electronic device. For example, the portable electronic device may be assembled by placing the gasket into the top enclosure of the portable electronic device with portion 906 open over wall 118. After the gasket is placed into the top enclosure of the portable electronic device, a part of rigid portion 904 may obstruct one or more vents in wall 118 to separate the intake and exhaust zones of wall 118. Next, fan 910 may be placed next to the gasket, and heat pipe 106 may be placed on top of rigid portion 904 and/or a second flexible portion (e.g., portion 908 of FIG. 9) of the gasket.

Figure 11:
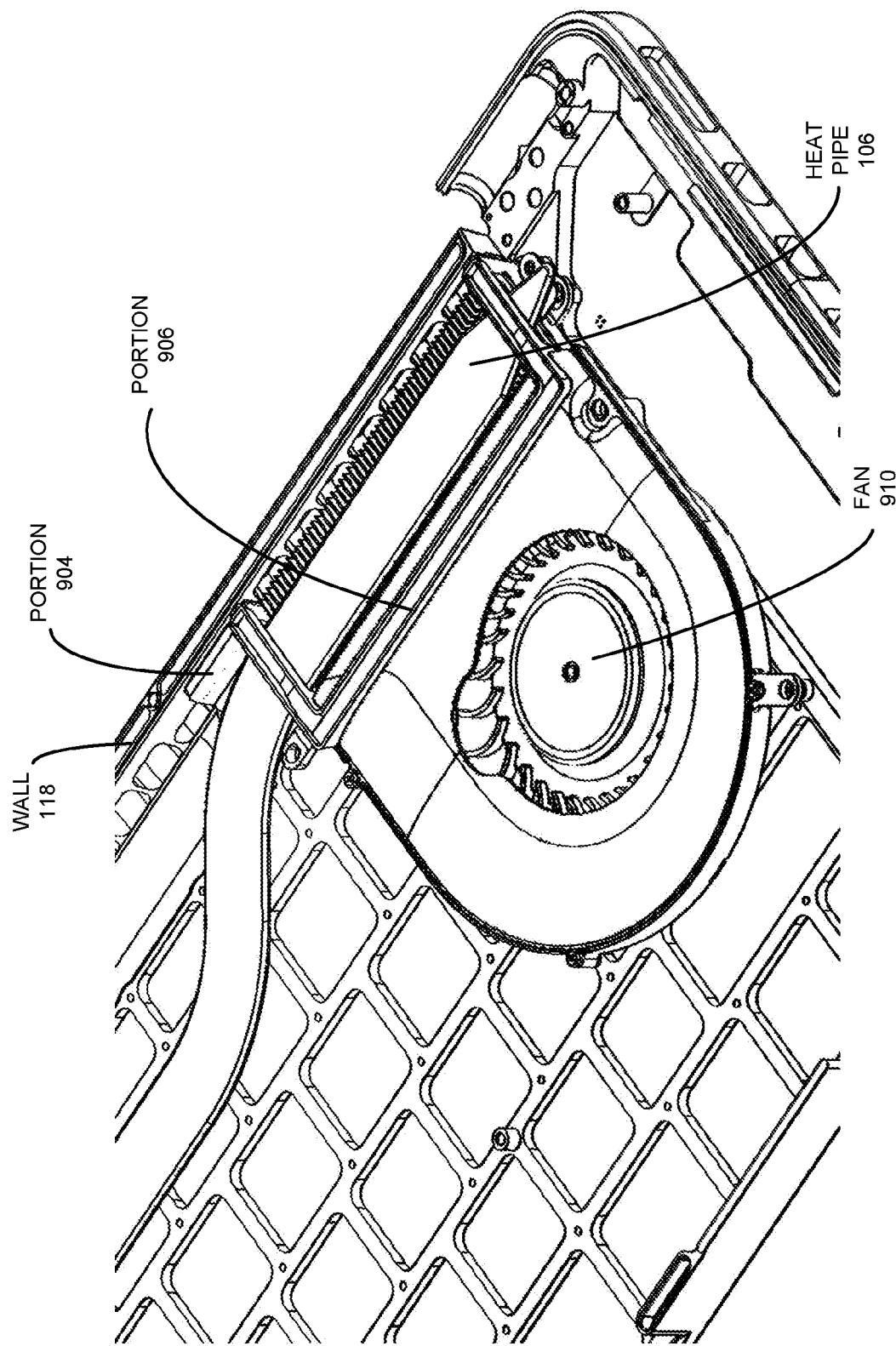
FIG. 11 is a block diagram illustrating a flexible portion of a gasket in accordance with an embodiment of the present disclosure.

FIG. 11 shows flexible portion 906 of a gasket (e.g., gasket 902 of FIG. 9). As shown in FIG. 11, portion 906 may be closed over heat pipe 106, rigid portion 904, and the second flexible portion after heat pipe 106 is assembled in the portable electronic device. The bottom enclosure of the portable electronic device may then be placed over the gasket to create a compression seal around heat pipe 106, fan 910, one or more exhaust vents of wall 118, and/or the top enclosure of the portable electronic device. In addition, the insulating materials used in the gasket may restrict heat transfer between the exhaust and the enclosure of the portable electronic device, thus facilitating safe operation of the portable electronic device.

Figure 12:
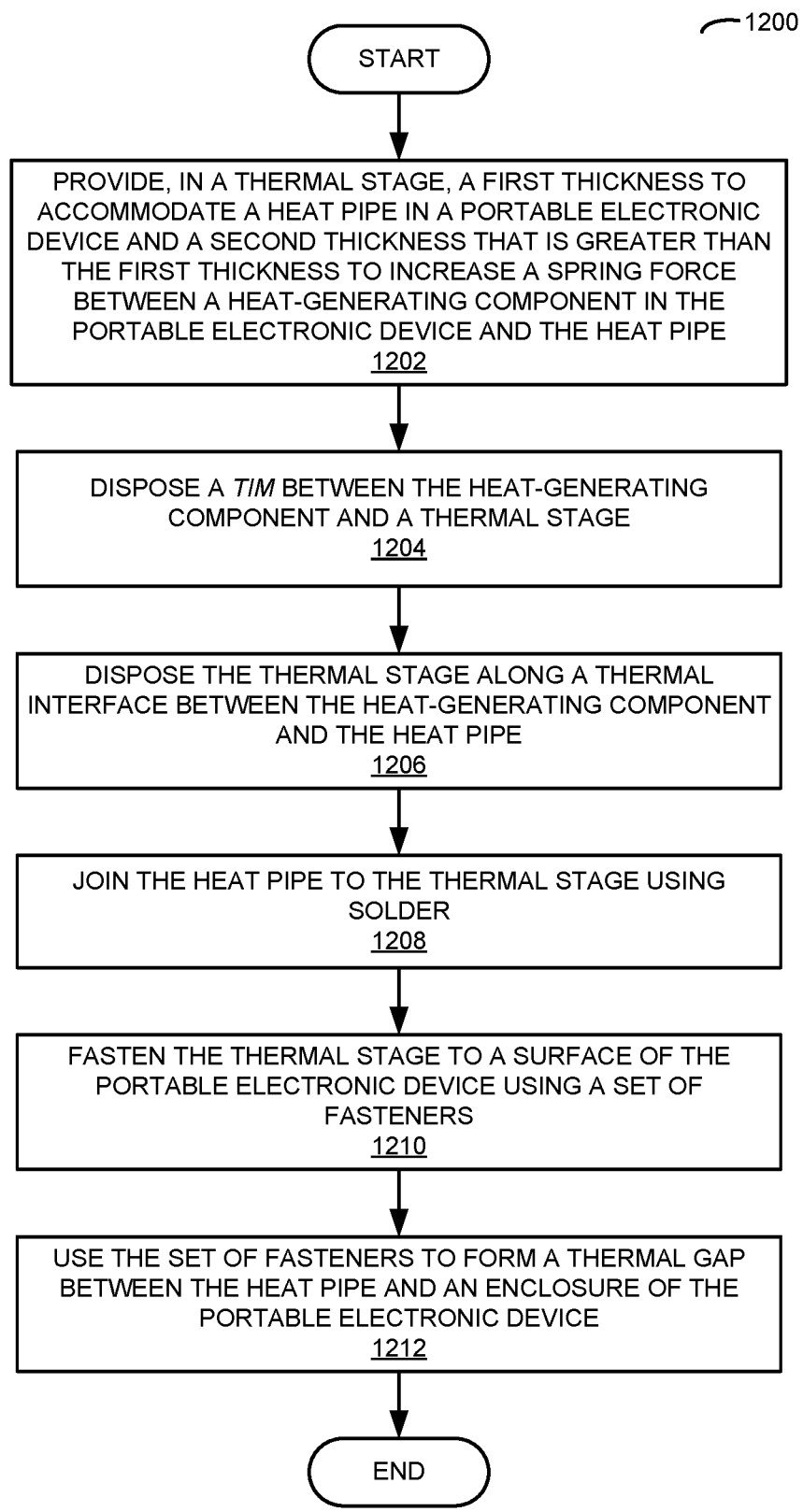
FIG. 12 is a flow chart illustrating a method of facilitating heat transfer in a portable electronic device in accordance with an embodiment of the present disclosure.

FIG. 12 shows a flow chart illustrating a method 1200 of facilitating heat transfer in a portable electronic device. During this method, a first thickness to accommodate a heat pipe in the portable electronic device and a second thickness that is greater than the first thickness to increase a spring force between the heat-generating component and the heat pipe are provided in a thermal stage (operation 1202). The thermal stage may be made of copper titanium and/or another material with a high thermal conductivity and/or spring constant. The first and/or second thicknesses may be created using a machining technique, a rolling technique, a skiving technique, a forging technique, a coining technique, a chemical etching technique, and/or a casting technique.

Next, a TIM is disposed between the heat-generating component and the thermal stage (operation 1204). For example, the TIM may be applied to a surface of the heat-generating component and/or the thermal stage. The thermal stage is then disposed along a thermal interface between the heat-generating component and the heat pipe (operation 1206), and the heat pipe is joined to the thermal stage using a solder (operation 1208). For example, the thermal stage may be placed over the heat-generating component, and the heat pipe may be placed over the thermal stage and soldered to the thermal stage.

The thermal stage is also fastened to a surface within the portable electronic device using a set of fasteners (operation 1210), and the set of fasteners is used to form a thermal gap between the heat pipe and the enclosure of the portable electronic device (operation 1212). For example, the fasteners may include screws with tall heads that form a plenum between the heat pipe and enclosure through which air may flow to further dissipate heat from the heat-generating component. The screws may also separate the heat pipe from the enclosure, thus preventing the heat pipe from transmitting large amounts of heat through the enclosure. Similarly, the heads of the screws may include an insulating material such as plastic to prevent the heat-generating component from thermally contacting the enclosure if the enclosure touches the screws' heads (e.g., as a result of impact between the portable electronic device and a hard surface and/or by design).

Figure 13:
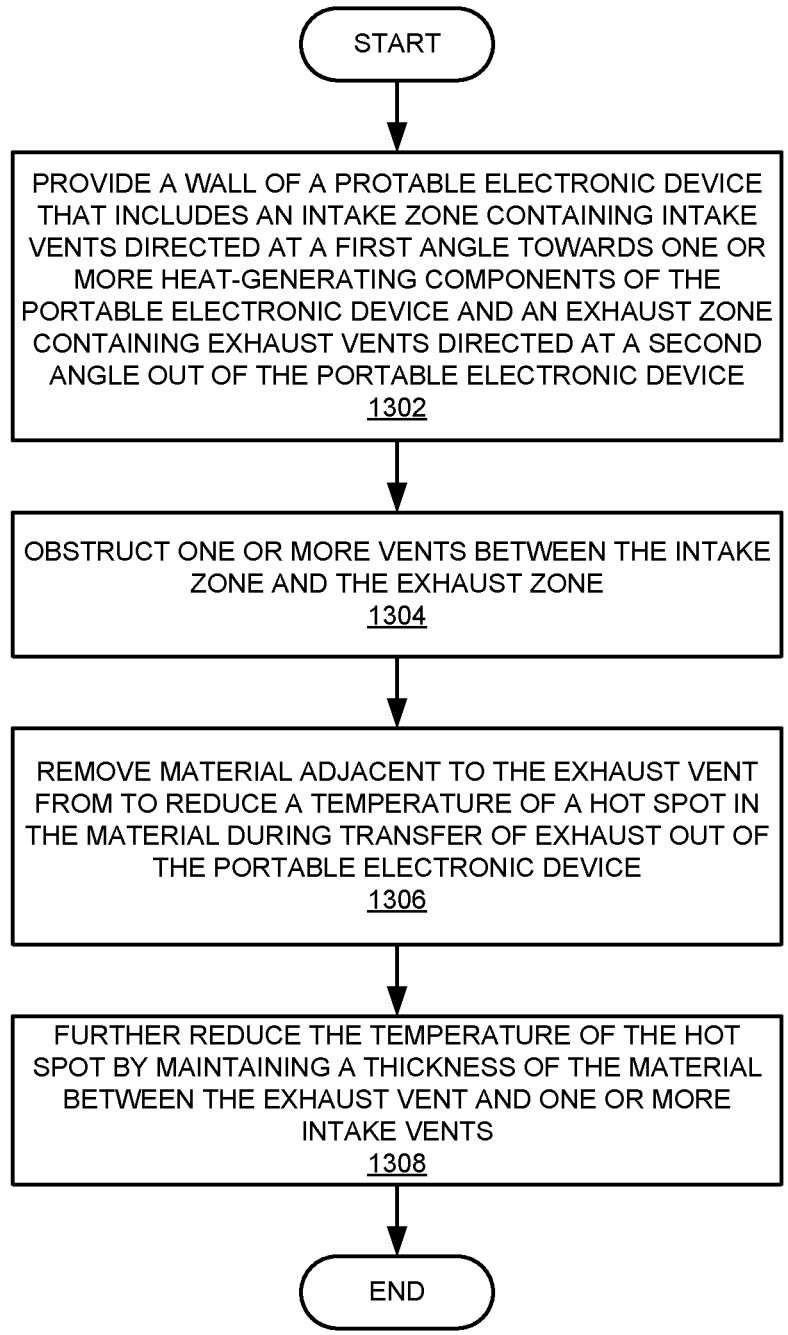
FIG. 13 is a flow chart illustrating a method of facilitating heat transfer in a portable electronic device in accordance with an embodiment of the present disclosure.

FIG. 13 shows a flow chart illustrating a method 1300 of facilitating heat transfer in a portable electronic device. During this method, a wall of the portable electronic device that includes an intake zone containing a set of intake vents directed at a first angle toward one or more heat-generating components of the portable electronic device and an exhaust zone containing a set of exhaust vents directed at a second angle out of the portable electronic device is provided (operation 1302). For example, the wall may be a rear wall that is integrated into a top case of a laptop computer. The first angle may facilitate the cooling of components at the top of a PCB in the laptop computer, while the second angle may direct exhaust out of the laptop computer so that the exhaust avoids the display of the laptop computer.

Next, one or more vents between the intake zone and exhaust zone are obstructed (operation 1304). The vents may be obstructed by a portion of a duct between a fan and the exhaust zone and/or another component in the portable electronic device. The obstructed vents may maintain the cosmetic continuity of the portable electronic device while separating the intake and exhaust flows passing through the intake and exhaust zones.

Material adjacent to the exhaust vent may also be removed to reduce a temperature of a hot spot in the material during the transfer of exhaust out of the portable electronic device (operation 1306). For example, the material may be removed using a T-cut to reduce the amount of heat conducted through the material to the outside of the portable electronic device's enclosure. The temperature of the hotspot may further be reduced by maintaining the thickness of the material between the exhaust vent and one or more intake vents (operation 1308) in the portable electronic device. For example, the thickness of material separating the exhaust vent from an intake vent to the side of the exhaust vent may be maintained to facilitate lateral conduction of heat from the exhaust vent to the intake vent.

Figure 14:
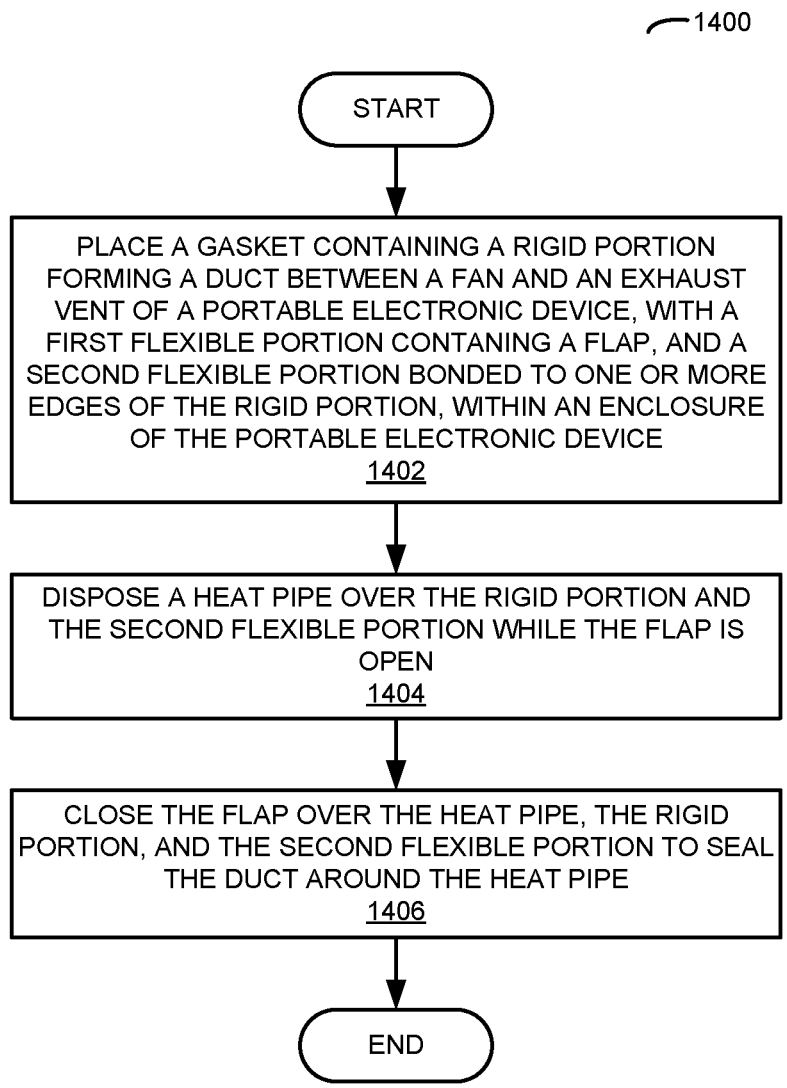
FIG. 14 is a flow chart illustrating a method of assembling a portable electronic device in accordance with an embodiment of the present disclosure.

FIG. 14 shows a flow chart illustrating a method 1400 of assembling a portable electronic device. During this method, a gasket containing a rigid portion forming a duct between a fan and exhaust vent of the portable electronic device, with a first flexible portion containing a flap, and a second flexible portion bonded to one or more edges of the rigid portion, is placed within an enclosure of the portable electronic device (operation 1402). For example, the gasket may be placed inside a top enclosure of the portable electronic device so that one end of the gasket is flush with a wall (e.g., wall 118 of FIG. 1) containing the exhaust vent, and a fan may be installed in the portable electronic device so that the other end of the gasket is flush with the fan. The rigid portion may be made of plastic, while the first and second flexible portions may be made of a rubber that is bonded to the rigid portion using an overmolding technique.

Next, a heat pipe is disposed over the rigid portion and second flexible portion while the flap is open (operation 1404). For example, the heat pipe may be assembled in the portable electronic device so that the heat pipe rests on top of the rigid portion and second flexible portion while the flap is open over the wall.

Moreover, the flap is closed over the heat pipe, the rigid portion, and the second flexible portion to seal the duct around the heat pipe (operation 1406). The first and second flexible portions may also seal the duct around the fan, the bottom enclosure of the portable electronic device, the top enclosure of the portable electronic device, and/or the exhaust vent. The gasket may thus prevent recirculation of exhaust within the portable electronic device, simplify the assembly of the heat pipe and/or portable electronic device, and/or insulate the enclosure of the portable electronic device from the heated exhaust.

Figure 15:
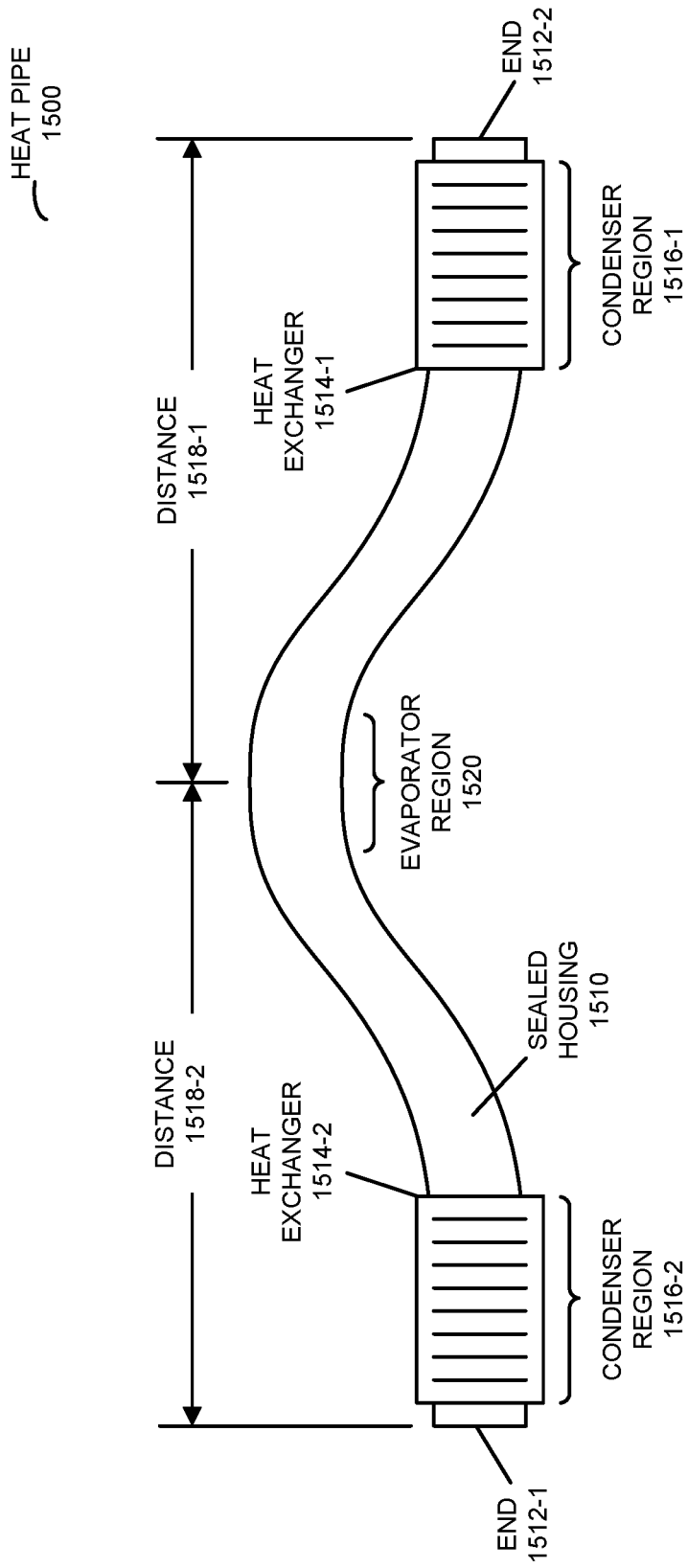
FIG. 15 is a block diagram illustrating a top view of a heat pipe in accordance with an embodiment of the present disclosure.

We now describe additional embodiments. FIG. 15 presents a block diagram illustrating a top view of a heat pipe 1500 that facilitates passive heat transfer. This heat pipe includes a sealed housing 1510, having ends 1512, which includes a thermal transport material (as described below with reference to FIG. 16). Moreover, heat pipe 1500 includes heat exchangers 1514 (such as convective-cooling fins) that are thermally coupled to sealed housing 1510 at condenser regions 1516 of sealed housing 1510 proximate to ends 1512.

Figure 16:
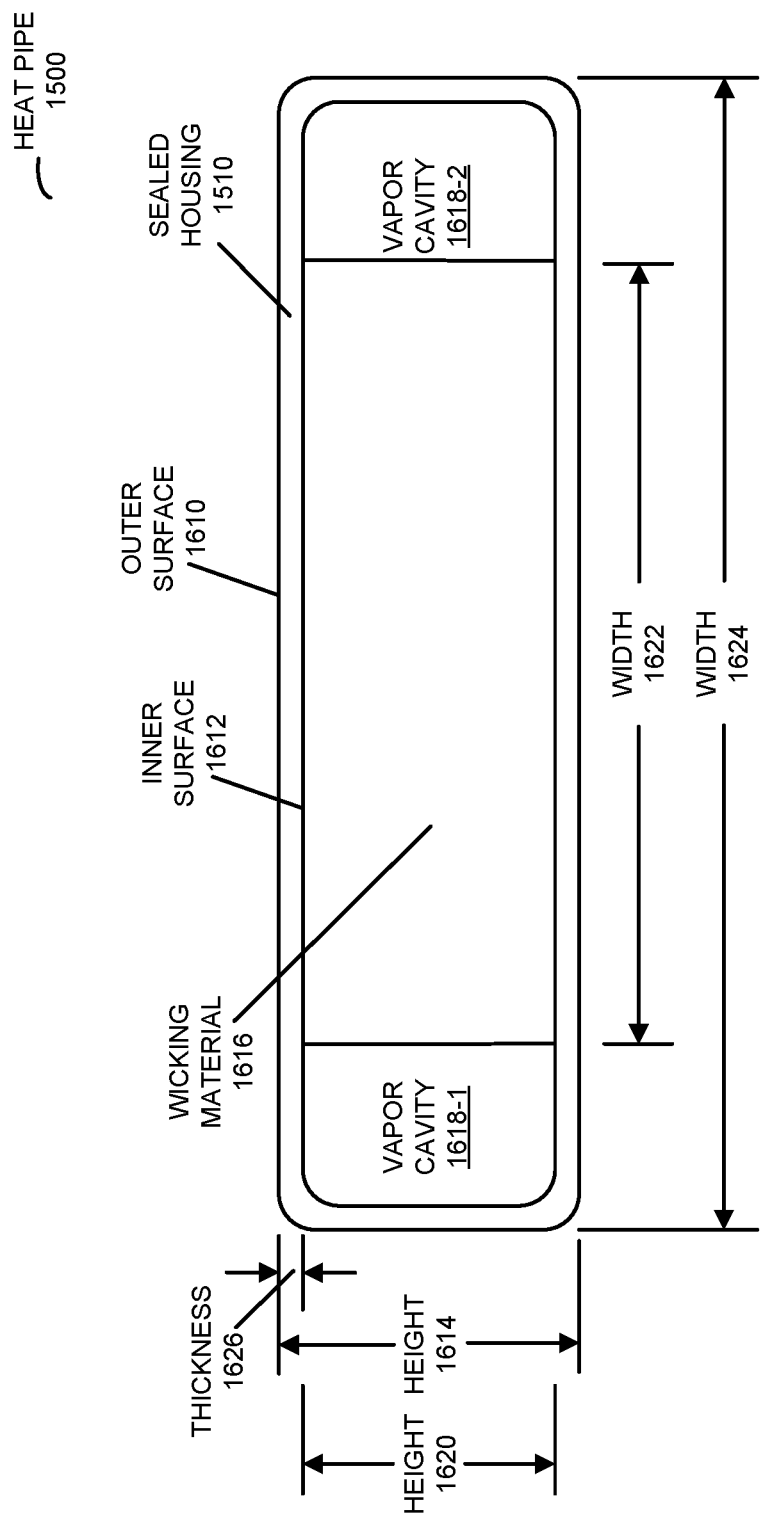
FIG. 16 is a block diagram illustrating a side view of the heat pipe of FIG. 1 in accordance with an embodiment of the present disclosure.

As shown in FIG. 16, which presents a block diagram illustrating a side view of heat pipe 1500, sealed housing 1510 has an outer surface 1610 and an inner surface 1612, as well as ends 1512 (FIG. 15). Furthermore, a height 1614 of sealed housing 1510 may be less than a predetermined value (such as less than or equal to 1.4 mm). For example, height 1614 may be 1.2 mm. This reduced height may facilitate the use of heat pipe 1500 in portable electronic devices with reduced form factors (as described further below with reference to FIG. 17).

In existing heat pipes, reducing height 1614 to the predetermined value would adversely impact the heat-transport capability. However, the internal structure of heat pipe 1500 facilitates improved heat-transport capability at heights as small as 1.2 mm (or smaller). In particular, sealed housing 1510 includes a wicking material 1616 along at least a portion of inner surface 1612 and vapor cavities 1618 (where there is no wicking material 1616), and sealed housing 1510 includes a thermal transport material in a liquid state, such as water.

The geometry of this internal structure (such as the geometries of wicking material 1616 and vapor cavities 1618) may be optimized to maximize the thermal power transported by heat pipe 1500. As illustrated in FIG. 16, in an exemplary embodiment vapor cavities 1618 are located at opposite sides of a cross-section of sealed housing 1510, and wicking material 1616 may be along at least a portion of inner surface 1612. A width 1622 of wicking material 1616 may be between 10 and 90% of width 1624 of sealed housing 1510, while width 1624 may be 11-12 mm. Moreover, a height 1620 of wicking material 1616 may be between 10-90% of height 1614. Furthermore, a thickness 1626 of sealed housing 110 may be between 0.1-0.5 mm, and wicking material 1616 may include sintered particles having diameters less than 500 µm. In some embodiments, sealed housing 1510 and wicking material 1616 may include copper (for example, they may be made of copper or a copper alloy).

During operation of heat pipe 1500, sealed housing 1510 supports a two-phase bidirectional flow of thermal transport material in the liquid state in wicking material 1616 and in a gas state in vapor cavities 1618. Referring to FIG. 15, thermal power (such as that associated with operation of one or more integrated circuits and, more generally, one or more components) is conductively coupled to sealed housing 1510 at evaporator region 1520 of sealed housing 1510. Heat associated with the thermal power converts some of the thermal transport material from the liquid state to the gas state. The gas transports the thermal power from evaporator region 1520 to condenser regions 1516, where it is transferred to heat exchangers 1514. In the process, the thermal transport material condenses back into the liquid state, where a return flow to evaporator region 1520 occurs in wicking material 1616 in FIG. 16. Thus, the two-phase bidirectional flow transports thermal power over distances 1518 from an evaporator region 1520 to heat exchangers 1514.

Furthermore, heat exchangers 1514 transfer the thermal power from sealed housing 1510 to an environment external to heat pipe 1500 (for example, in conjunction with forced-fluid drivers, such as fans, that force air over heat exchangers 1514), and a product of the thermal power and a distance (or effective length) equal to two times either of distances 1518 exceeds a predetermined value, which may be larger than or equal to 2,000 W-mm (such as 2,030 or 3,050 W-mm). For example, distances 1518 may each be 120 mm (so that two times either of distances 1518 is 240 mm), and the thermal power may be greater than or equal to 35 W (such as 40 or 60 W) with a heat flux of more than 27 W/cm2 (such as 32 or 34 W/cm2).

Note that heat pipe 1500 may also be designed so that, during operation of heat pipe 1500, sealed housing 1510 may reduce acoustic sound associated with bubbles of the gas phase of thermal transport material. For example, the geometry of wicking material 1616 and vapor cavities 1618 in FIG. 16 may be selected so that the bubbling noise that can occur as the gas phase moves through the liquid phase of the thermal transport material is reduced or eliminated.

Figure 17:
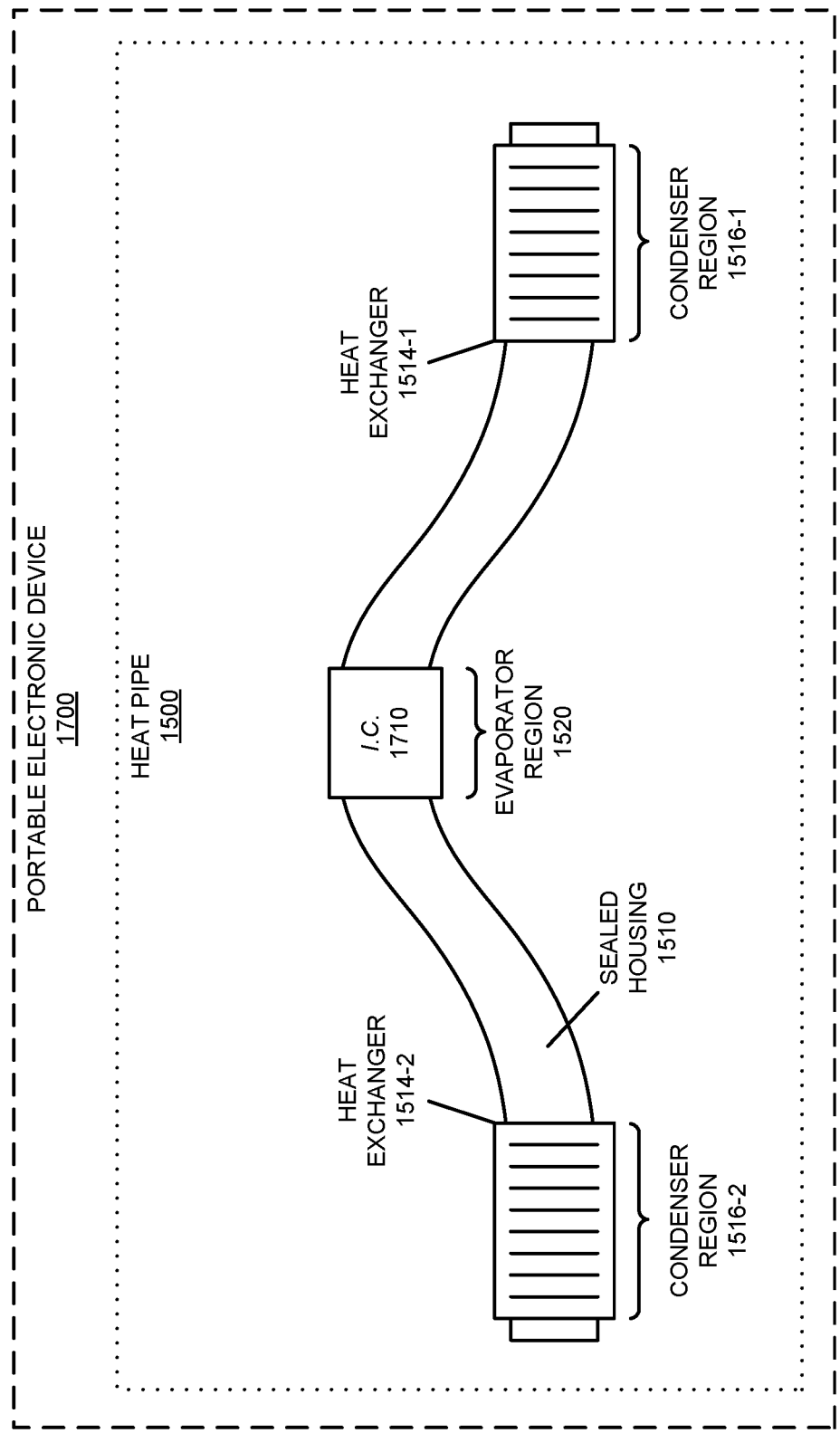
FIG. 17 is a block diagram illustrating a top view of a portable electronic device in accordance with an embodiment of the present disclosure.

Heat pipe 1500 may be included in an electronic device, such as a portable electronic device. This is shown in FIG. 17, which presents a block diagram illustrating a top view of portable electronic device 1700 that includes heat pipe 1500. Moreover, integrated circuit (I.C.) 1710, which generates heat during operation of portable electronic device 1700, may be thermally coupled to heat pipe 1500 proximate to evaporator region 1520 of sealed housing 1510. For example, integrated circuit 1710 may be thermally coupled to heat pipe 1500 by an intervening copper plate (not shown). In this way, thermal power may be transferred to heat pipe 1500, which, as described previously, then passively conveys it out of portable electronic device 1700.

We now describe embodiments of a method that can be performed using the preceding embodiments. FIG. 18 presents a flowchart illustrating a method 1800 for cooling a portable electronic device, such as portable electronic device 1700 (FIG. 17). During operation of the portable electronic device, heat generated by an integrated circuit in the portable electronic device is transported over the distance from the evaporator region of the sealed housing in the heat pipe to the heat exchangers at the condenser regions of the sealed housing (operation 1810). This thermal power is transported via the two-phase bidirectional flow of the thermal transport material in the liquid state and in the gas state in the sealed housing, where the sealed housing has the height less than the predetermined value, and the product of the thermal power and the distance (or effective length) exceeds the second predetermined value. Then, using the heat exchangers, the thermal power is transferred from the sealed housing to the environment external to the portable electronic device (operation 1812).

In some embodiments of methods 1200 (FIG. 12), 1300 (FIG. 13), 1400 (FIG. 14) or 1800 there may be additional or fewer operations. Moreover, the order of the operations may be changed, and/or two or more operations may be combined into a single operation.

Figure 19:
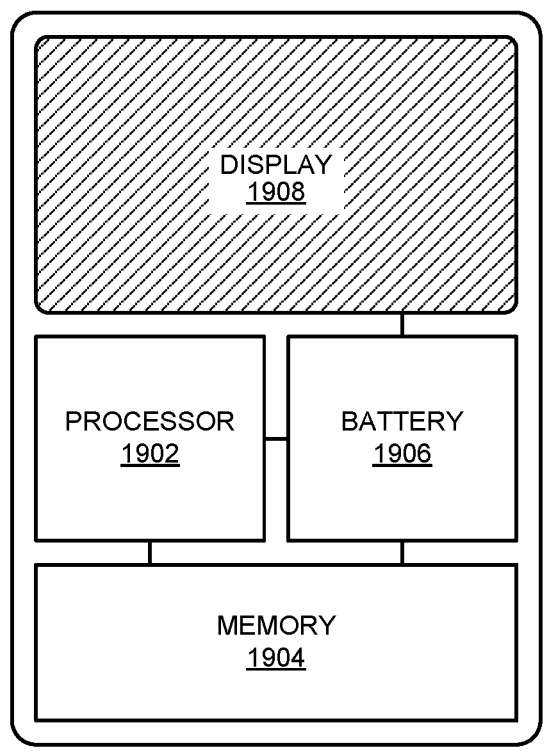
FIG. 19 is a block diagram illustrating a portable electronic device in accordance with an embodiment of the present disclosure.

The above-described heat transfer mechanisms can generally be used in any type of electronic device. For example, FIG. 19 illustrates a portable electronic device 1900 which includes a processor 1902, a memory 1904 and a display 1908, which are all powered by a battery 1906. This portable electronic device may include: one or more program modules or sets of instructions stored in an optional memory subsystem (not shown). These sets of instructions may be executed by an optional processing subsystem (such as one or more processors) on a motherboard (not shown). Note that the one or more computer programs may constitute a computer-program mechanism. Moreover, instructions in the various modules in the optional memory subsystem may be implemented in: a high-level procedural language, an object-oriented programming language, and/or in an assembly or machine language. Furthermore, the programming language may be compiled or interpreted, e.g., configurable or configured, to be executed by the optional processing subsystem.

In some embodiments, functionality in these circuits, components and devices may be implemented in one or more: application-specific integrated circuits (ASICs), field-programmable gate arrays (FPGAs), and/or one or more digital signal processors (DSPs). Moreover, the circuits and components may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

Portable electronic device 1900 may include one of a variety of devices that can include memory, including: a laptop computer, a media player (such as an MP3 player), an appliance, a subnotebook/netbook, a tablet computer, a smartphone, a cellular telephone, a network appliance, a personal digital assistant (PDA), a toy, a controller, a digital signal processor, a game console, a device controller, a computational engine within an appliance, a consumer-electronic device, a portable computing device, a digital camera, a personal organizer, and/or another electronic device, such as another type of battery-powered electronic device.

In order to cool heat-generating components in portable electronic device 1900, portable electronic device 1900 may include a heat pipe that conducts heat away from the heat-generating components and/or one or more fans that expel the heat out of portable electronic device 1900.

Portable electronic device 1900 may also include a thermal stage disposed along a thermal interface between a heat-generating component and the heat pipe. The thermal stage may include a first thickness to accommodate the heat pipe and a second thickness that is greater than the first thickness to increase the spring force between the heat-generating component and the heat pipe. The thermal stage may also be fastened to a surface within portable electronic device 1900 by a set of fasteners that form a thermal gap between the heat pipe and the enclosure of portable electronic device 1900.

Moreover, in order to further facilitate cooling of the heat-generating components, a wall of portable electronic device 1900 may include an intake zone containing a set of intake vents directed at a first angle toward one or more of the heat-generating components. The wall may also include an exhaust zone containing a set of exhaust vents directed at a second angle out of the electronic device (e.g., to avoid a display of the electronic device). One or more vents may be obstructed between the intake and exhaust zones to separate the intake and exhaust zones. In addition, the temperature of a hot spot near an exhaust vent may be reduced by removing material adjacent to the exhaust vent and/or maintaining a thickness of the material between the exhaust vent and one or more intake vents.

Furthermore, a gasket may prevent the recirculation of exhaust inside the electronic device. The gasket may include a rigid portion that forms a duct between a fan and an exhaust vent. The gasket may also include a first flexible portion bonded to the rigid portion, as well as a second flexible portion bonded to one or more edges of the rigid portion. The first flexible portion may be a flap that is open during assembly of the heat pipe in the electronic device and closed over the heat pipe and the rigid portion to seal the duct around the heat pipe after the assembly. The first and second flexible portions may further seal the duct around the fan, the bottom enclosure of the electronic device, the top enclosure of the electronic device, and/or the exhaust vent.

While a portable electronic device was used as an illustration in the preceding discussion, in other embodiments the heat-transfer technique is included in an electronic device, such as a server, a desktop computer, a mainframe computer and/or a blade computer. Furthermore, alternative heat transfer components and/or materials may be used in heat pipe 1500 (FIG. 15).

Additionally, one or more of the components may not be present in the FIGS. 1-11 and 15-17. In some embodiments, the preceding embodiments include one or more additional components that are not shown in FIGS. 1-11 and 15-17. Also, although separate components are shown in FIGS. 1-11 and 15-17, in some embodiments some or all of a given component can be integrated into one or more of the other components and/or positions of components can be changed.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A heat pipe, comprising:
a sealed housing having an outer surface, an inner surface, vapor cavities, two ends and a height less than a predetermined value, wherein the sealed housing includes a wicking material along at least a portion of the inner surface, and wherein the sealed housing includes a thermal transport material in a liquid state; and
heat exchangers, thermally coupled to the sealed housing, at condenser regions of the sealed housing proximate to the ends of the sealed housing, wherein, during operation of the heat pipe, the sealed housing is configured to support a two-phase bidirectional flow of the thermal transport material in the liquid state in the wicking material and in a gas state in the vapor cavities to transport thermal power over a distance from an evaporator region of the sealed housing to the heat exchangers;
wherein the heat exchangers are configured to transfer the thermal power from the sealed housing to an environment external to the heat pipe; and
wherein a product of the thermal power and the distance exceeds a second predetermined value.

2. The heat pipe of claim 1, wherein the predetermined value is less than or equal to 1.4 mm.

3. The heat pipe of claim 1, wherein the second predetermined value is larger than or equal to 2,000 W-mm.

4. The heat pipe of claim 1, wherein the thermal transport material includes water.

5. The heat pipe of claim 1, wherein the thermal power is greater than or equal to 35 W.

6. The heat pipe of claim 1, wherein the wicking material includes sintered particles having diameters less than 500 $\mu$m.

7. The heat pipe of claim 1, wherein the vapor cavities are located at opposite sides of a cross-section of the sealed housing.

8. The heat pipe of claim 1, wherein, during operation of the heat pipe, the sealed housing is configured to reduce acoustic sound associated with bubbles of the gas phase of the thermal transport material.

9. The heat pipe of claim 1, wherein the sealed housing and the wicking material include copper.

10. The heat pipe of claim 1, wherein the heat exchangers include convective-cooling fins.

11. A portable electronic device, comprising:
an integrated circuit configured to generate heat during operation of the portable electronic device; and
a heat pipe thermally coupled to the integrated circuit, wherein the heat pipe includes:
a sealed housing having an outer surface, an inner surface, two vapor cavities, two ends and a height less than a predetermined value, wherein the sealed housing includes a wicking material along at least a portion of the inner surface, and wherein the sealed housing includes a thermal transport material in a liquid state; and
heat exchangers, thermally coupled to the sealed housing, at condenser regions of the sealed housing proximate to the ends of the sealed housing, wherein, during operation of the portable electronic device, the sealed housing is configured to support a two-phase bidirectional flow of the thermal transport material in the liquid state in the wicking material and in a gas state in the vapor cavities to transport thermal power over a distance from an evaporator region of the sealed housing, which is proximate to the integrated circuit, to the heat exchangers;
wherein the heat exchangers are configured to transfer the thermal power from the sealed housing to an environment external to the portable electronic device; and
wherein a product of the thermal power and the distance exceeds a second predetermined value.

12. The portable electronic device of claim 11, wherein the predetermined value is less than or equal to 1.4 mm.

13. The portable electronic device of claim 11, wherein the second predetermined value is larger than or equal to 2,000 W-mm.

14. The portable electronic device of claim 11, wherein the thermal transport material includes water.

15. The portable electronic device of claim 11, wherein the thermal power is greater than or equal to 35 W.

16. The portable electronic device of claim 11, wherein the wicking material includes sintered particles having diameters 500 $\mu$m.

17. The portable electronic device of claim 11, wherein the vapor cavities are located at opposite sides of a cross-section of the sealed housing.

18. The portable electronic device of claim 11, wherein, during operation of the portable electronic device, the sealed housing is configured to reduce acoustic sound associated with bubbles of the gas phase of the thermal transport material.

19. The portable electronic device of claim 11, wherein the heat exchangers include convective-cooling fins.

20. A method for cooling a portable electronic device, comprising:
transporting heat generated by operation of an integrated circuit in the portable electronic device over a distance from an evaporator region of a sealed housing in a heat pipe to heat exchangers at condenser regions of the sealed housing, wherein the thermal power is transported via a two-phase bidirectional flow of a thermal transport material in a liquid state and in a gas state in the sealed housing, wherein the sealed housing has a height less than a predetermined value, and wherein a product of the thermal power and the distance exceeds a second predetermined value; and
using the heat exchangers, transferring the thermal power from the sealed housing to an environment external to the portable electronic device.

* * * * *